(12) United States Patent
Fujita

(10) Patent No.: US 8,259,487 B2
(45) Date of Patent: *Sep. 4, 2012

(54) SEMICONDUCTOR MEMORY DEVICE AND SEMICONDUCTOR DEVICE

(75) Inventor: Masashi Fujita, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/086,784

(22) Filed: Apr. 14, 2011

(65) Prior Publication Data
US 2011/0188296 A1 Aug. 4, 2011

Related U.S. Application Data

(63) Continuation of application No. 12/144,032, filed on Jun. 23, 2008, now Pat. No. 7,929,332.

(30) Foreign Application Priority Data

Jun. 29, 2007 (JP) ................................. 2007-172938

(51) Int. Cl.
G11C 11/00 (2006.01)

(52) U.S. Cl. .................... 365/154; 365/156; 365/185.23; 365/182; 365/188

(58) Field of Classification Search .................. 365/154, 365/156, 185.23, 182, 188
See application file for complete search history.

(56) References Cited

U.S. PATENT DOCUMENTS

| 4,879,687 | A | 11/1989 | Okamoto et al. |
| 5,018,102 | A | 5/1991 | Houston |
| 5,212,663 | A | 5/1993 | Leong |
| 5,325,325 | A | 6/1994 | Azuma |
| 5,327,376 | A | 7/1994 | Semi |
| 5,333,127 | A | 7/1994 | Hiraki et al. |
| 5,621,693 | A | 4/1997 | Nakase |
| 5,749,090 | A | 5/1998 | Feng et al. |
| 6,061,267 | A | 5/2000 | Houston |
| 6,128,215 | A | 10/2000 | Lee |
| 6,190,952 | B1 | 2/2001 | Xiang et al. |
| 6,353,551 | B1 | 3/2002 | Lee |
| 6,556,487 | B1 * | 4/2003 | Ratnakumar et al. .... 365/185.08 |
| 6,657,887 | B2 | 12/2003 | Higeta et al. |
| 6,787,835 | B2 * | 9/2004 | Atwood et al. ............... 257/296 |

(Continued)

FOREIGN PATENT DOCUMENTS
EP 0 344 894 A2 12/1989
(Continued)

OTHER PUBLICATIONS

European Search Report re application No. EP 08011382.2, dated Jul. 20, 2009.

Primary Examiner — Viet Q Nguyen
(74) Attorney, Agent, or Firm — Husch Blackwell LLP

(57) ABSTRACT

The semiconductor memory device includes an initialization memory cell having a first inverter circuit including a first transistor and a second transistor, and a second inverter circuit whose input portion is connected to an output portion of the first inverter circuit and output portion is connected to an input portion of the first inverter circuit, and including a third transistor and a fourth transistor. An absolute value of a threshold voltage of the third transistor is smaller than that of the first transistor.

19 Claims, 17 Drawing Sheets

U.S. PATENT DOCUMENTS

| | | | |
|---|---|---|---|
| 6,829,179 B2 | 12/2004 | Morikawa | |
| 6,862,207 B2 | 3/2005 | Wei et al. | |
| 6,888,202 B2 | 5/2005 | Kang et al. | |
| 7,069,388 B1 | 6/2006 | Greenfield et al. | |
| 7,079,413 B2 * | 7/2006 | Tsukamoto et al. | 365/154 |
| 7,319,667 B1 * | 1/2008 | Biederman | 370/231 |
| 7,362,606 B2 * | 4/2008 | Chuang et al. | 365/154 |
| 7,385,838 B2 * | 6/2008 | Osada et al. | 365/148 |
| 7,420,836 B1 | 9/2008 | Kim et al. | |
| 7,443,717 B2 | 10/2008 | Fujita et al. | |
| 7,460,408 B2 | 12/2008 | Yabe | |
| 7,468,902 B2 | 12/2008 | Liaw | |
| 7,522,445 B2 | 4/2009 | Inaba | |
| 7,570,525 B2 * | 8/2009 | Nii et al. | 365/189.11 |
| 7,588,973 B2 | 9/2009 | Ushiku | |
| 7,706,205 B2 * | 4/2010 | Itoh et al. | 365/227 |
| 7,710,765 B2 | 5/2010 | Hanafi | |
| 7,929,332 B2 * | 4/2011 | Fujita | 365/154 |
| 7,952,955 B2 * | 5/2011 | Kodama | 365/230.06 |
| 2004/0062083 A1 | 4/2004 | Layman et al. | |
| 2004/0141363 A1 | 7/2004 | Ohtsuka et al. | |
| 2004/0259295 A1 | 12/2004 | Tomiye et al. | |
| 2005/0093035 A1 | 5/2005 | Yagishita et al. | |
| 2006/0039180 A1 | 2/2006 | Kawasumi | |
| 2006/0098474 A1 | 5/2006 | Dang et al. | |
| 2007/0025143 A1 | 2/2007 | Fujita et al. | |
| 2007/0076468 A1 | 4/2007 | Schoellkopf | |
| 2007/0252181 A1 | 11/2007 | Yamada et al. | |
| 2009/0116278 A1 | 5/2009 | Fujita et al. | |

FOREIGN PATENT DOCUMENTS

| | | |
|---|---|---|
| EP | 0 898 281 A2 | 2/1999 |
| EP | 1 750 276 A1 | 2/2007 |
| FR | 2 891 652 A1 | 4/2007 |
| JP | 2005-44142 | 2/2005 |
| WO | WO 2006-106890 A1 | 10/2006 |

* cited by examiner

SEMICONDUCTOR MEMORY DEVICE AND SEMICONDUCTOR DEVICE

This application is a continuation of U.S. application Ser. No. 12/144,032 filed on Jun. 23, 2008 now U.S. Pat. No. 7,929,332.

BACKGROUND OF THE INVENTION

1. Field of the Invention

The present invention relates to a semiconductor memory device or a semiconductor device provided with the semiconductor memory device.

2. Description of the Related Art

Almost all architecture of existing CPUs (central processing units) is what is called stored program system. In this stored program system, commands to be processed by the CPU and data required for processing are stored in memory devices. The CPU performs processing by sequentially reading the data from the memory devices.

However, this architecture has a problem of an access speed to the memory device. Since the memory device stores the command to be processed by the CPU and data required for processing, a memory device with high capacitance is required. However, it is difficult to achieve both high capacitance and high-speed processing because a memory device which is capable of high-speed processing is expensive. As an exemplary structure which is capable of high-speed processing even if the memory device has high capacitance, a structure of combination of a memory device with high capacitance and a low processing speed, and a cache memory which is one of memory devices which have low capacitance and are capable of high-speed processing can be given. In that case, the memory device with high capacitance and a low processing speed is a main memory device (also referred to as a main memory) and the memory device which has low capacitance and is capable of high-speed processing is a subordinate memory device.

In operation of the structure of combination of the main memory and the cache memory, part of the data in the main memory is copied into the cache memory and the CPU normally accesses to only the cache memory. Note that to access to the cache memory is called cache access. In an irregular case where required data is not in the cache memory, the CPU recopies the data in the main memory into the cache memory and accesses to the cache memory again. In first cache access, since the data is copied from the main memory, accessing needs some time. On the other hand, in second cache access or later, since the CPU accesses to only the cache memory, processing is performed at higher speed than that in the case of accessing to the main memory. Note that the case where data the CPU requires is in the cache memory is called a cache hit, and the case where the data the CPU requires is not in the cache memory is called a cache miss.

The cache memory which is used in combination with the main memory includes memory lines which are groups of combinations of tag memories and data memories. Each memory line includes a valid bit in the tag memory. The valid bit shows whether data stored in the memory line is valid or invalid. Here, for example, the case where invalid data is stored in the memory line corresponds to a time immediately after power supply is turned on. In this case, invalidation processing is required for the valid bits in all the memory lines. This is because the cache memory generally includes an SRAM (static random access memory) and cannot hold data when power supply is off; therefore, the data stored in the cache memory cannot be identified immediately after the power supply is turned on.

However, the invalidation processing for the valid bit is performed on every single memory line and takes some time. Further, during the invalidation processing, the CPU has to be on standby.

Here, a timing chart showing an example of conventional invalidation processing of a valid bit is shown in FIG. 12.

In FIG. 12, a clock signal is a signal 700, a request signal for invalidation processing is a signal 701, a counter signal which is to be an address in the invalidation processing is a signal 702, and a cache access signal from a CPU is a signal 703. When a pulse of the signal 701 is input at an event timing 704, the signal 702 is sequentially counted up with respect to a clock cycle of the signal 700, and the valid bit is sequentially invalidated in accordance with the signal 702 as the address for accessing the cache memory. At an event timing 705, when a counter value reaches the sum of memory lines (n memory lines) which should be invalidated, invalidation processing is completed. Then, a pulse of the signal 703 is input, whereby a normal cache access is started.

In view of the above-described problem, a cache memory which is aimed at speed-up of processing has been proposed in which a control circuit or a buffer circuit is added to a cache memory so that the CPU does not come in a standby state during invalidation processing for the valid bit, and CPU's accessing to the cache memory is judged as a cache miss, and a CPU accesses the main memory in order to promptly store data required after completion of the invalidation processing, in the cache memory (see Patent Document 1: Japanese Published Patent Application No. 2005-44142).

SUMMARY OF THE INVENTION

However, since the invalidation processing for a valid bit is performed on every single memory line, a processing time for (the number of memory lines in the cache memory×one cycle) maximum is required. The higher the capacitance of the cache memory becomes, the longer the processing time may become. Therefore, more speed-up of invalidation processing is necessary in order to greatly shorten the processing time.

An object of the present invention is to provide a semiconductor memory device in which initialization processing such as invalidation processing for making data stored in the semiconductor memory device to be in an initial state can be performed at high-speed and to provide a semiconductor device provided with the semiconductor memory device.

In view of the above-mentioned object, the present invention is a semiconductor memory device which automatically performs invalidation processing in a memory cell and a semiconductor device including the semiconductor memory device.

Further specifically, one aspect of the present invention is a semiconductor memory device including a data hold memory cell having a function of holding data, an initialization memory cell having a function of initializing a plurality of the memory cells, a first data line, a second data line, a third data line, a first word line, a second word line, a power supply line, and a ground line. The data hold memory cell and the initialization memory cell include a first inverter circuit having a first transistor which is a p-channel transistor and a second transistor which is an n-channel transistor, a second inverter circuit having a third transistor which is a p-channel transistor and a fourth transistor which is an n-channel transistor, a fifth transistor which has a gate terminal electrically connected to the first word line, a first terminal electrically connected to the first data line, and a second terminal electrically connected to an output terminal of the first inverter circuit, a sixth transistor which has a gate terminal electrically connected to the first word line, a first terminal electrically connected to an output terminal of the second inverter circuit, and a second terminal electrically connected to the second data line, a seventh transistor which has a gate terminal electrically connected to an input terminal of the first inverter circuit and the output terminal of the second inverter circuit and a first terminal electrically connected to the ground line, and an eighth transistor which has a gate terminal electrically connected to the second word line, a first terminal electrically connected to a second terminal of the seventh transistor, and a second terminal electrically connected to the third data line. The input terminal of the first inverter circuit is electrically connected to the output terminal of the second inverter circuit, the output terminal of the first inverter circuit is electrically connected to an input terminal of the second inverter circuit, a first potential supply terminal of the first inverter circuit is electrically connected to the power supply line, and a second potential supply terminal of the first inverter circuit is electrically connected to the ground line. A first potential supply terminal of the second inverter circuit is electrically connected to the power supply line and a second potential supply terminal of the second inverter circuit is electrically connected to the ground line. An absolute value of a threshold voltage of the third transistor is smaller than an absolute value of a threshold voltage of the first transistor in the initialization memory cell.

Note that the aspect of the present invention may have a structure including a resistor element, a capacitor element, and a ninth transistor which has a gate terminal electrically connected to the power supply line through the resistor element and electrically connected to the ground line through the capacitor element, a first terminal electrically connected to the first word line, and a second terminal electrically connected to the ground line.

One aspect of the present invention is a semiconductor memory device including a data hold memory cell having a function of holding data, an initialization memory cell having a function of initializing a plurality of the memory cells, a first data line, a second data line, a third data line, a first word line, a second word line, a power supply line, and a ground line. The data hold memory cell and the initialization memory cell include a first inverter circuit having a first transistor which is a p-channel transistor and a second transistor which is an n-channel transistor, a second inverter circuit having a third transistor which is a p-channel transistor and a fourth transistor which is an n-channel transistor, a fifth transistor which has a gate terminal electrically connected to the first word line, a first terminal electrically connected to the first data line, and a second terminal electrically connected to an output terminal of the first inverter circuit, a sixth transistor which has a gate terminal electrically connected to the first word line, a first terminal electrically connected to an output terminal of the second inverter circuit, and a second terminal electrically connected to the second data line, a seventh transistor which has a gate terminal is electrically connected to an input terminal of the first inverter circuit and the output terminal of the second inverter circuit and a first terminal electrically connected to the power supply line, and an eighth transistor which has a gate terminal electrically connected to the second word line, a first terminal electrically connected to a second terminal of the seventh transistor, and a second terminal electrically connected to the third data line. The input terminal of the first inverter circuit is electrically connected to the output terminal of the second inverter circuit, the output terminal of the first inverter circuit is electrically connected to an input terminal of the second inverter circuit, a first potential supply terminal of the first inverter circuit is electrically connected to the power supply line, and a second potential supply terminal of the first inverter circuit is electrically connected to the ground line. A first potential supply terminal of the second inverter circuit is electrically connected to the power supply line and a second potential supply terminal of the second inverter circuit is electrically connected to the ground line. An absolute value of a threshold voltage of the third transistor is smaller than an absolute value of a threshold voltage of the first transistor in the initialization memory cell.

Note that the aspect of the present invention may have a structure including a resistor element, a capacitor element, and a ninth transistor which has a gate terminal electrically connected to the power supply line through the resistor element and electrically connected to the ground line through the capacitor element, a first terminal electrically connected to the first word line, and a second terminal electrically connected to the power supply line.

One aspect of the present invention is a semiconductor memory device including a data hold memory cell having a function of holding data, an initialization memory cell having a function of initializing a plurality of the memory cells, a first data line, a second data line, a word line, a power supply line, and a ground line. The data hold memory cell and the initialization memory cell include a first inverter circuit having a first transistor which is a p-channel transistor and a second transistor which is an n-channel transistor, a second inverter circuit having a third transistor which is a p-channel transistor and a fourth transistor which is an n-channel transistor, a fifth transistor which has a gate terminal electrically connected to the word line, a first terminal electrically connected to the first data line, and a second terminal electrically connected to an output terminal of the first inverter circuit, and a sixth transistor which has a gate terminal electrically connected to the word line, a first terminal electrically connected to an output terminal of the second inverter circuit, and a second terminal electrically connected to the second data line. The input terminal of the first inverter circuit is electrically connected to the output terminal of the second inverter circuit, the output terminal of the first inverter circuit is electrically connected to an input terminal of the second inverter circuit, a first potential supply terminal of the first inverter circuit is electrically connected to the power supply line, and a second potential supply terminal of the first inverter circuit is electrically connected to the ground line. A first potential supply terminal of the second inverter circuit is electrically connected to the power supply line and a second potential supply terminal of the second inverter circuit is electrically connected to the ground line. An absolute value of a threshold voltage of the third transistor is smaller than an absolute value of a threshold voltage of the first transistor in the initialization memory cell.

Note that in the present invention, a thickness of a semiconductor layer of the first transistor may be more than or equal to quarter and less than or equal to half a channel length of the first transistor, and a thickness of a semiconductor layer of the third transistor may be more than or equal to half a channel length of the third transistor.

Further, a thickness of a semiconductor layer of the second transistor may be more than or equal to half a channel length of the second transistor, and a thickness of a semiconductor layer of the fourth transistor may be more than or equal to quarter and less than or equal to half a channel length of the fourth transistor.

In addition, in the present invention, any of the first to fourth transistors may include a substrate terminal to which a voltage for controlling a threshold voltage of the transistor is input.

Note that in the present invention, an absolute value of a threshold voltage of the second transistor may be smaller than an absolute value of a threshold voltage of the fourth transistor.

One aspect of the present invention is a semiconductor device including a first memory device having a semiconductor memory device of the present invention, a CPU having an arithmetic unit, and a second memory device. The second memory device is a main memory device and the first memory device is a subordinate memory device.

By employing the present invention, a semiconductor memory device which can perform initialization processing at higher speed and a semiconductor device including the semiconductor memory device can be obtained.

DETAILED DESCRIPTION OF THE INVENTION

Figure 1:
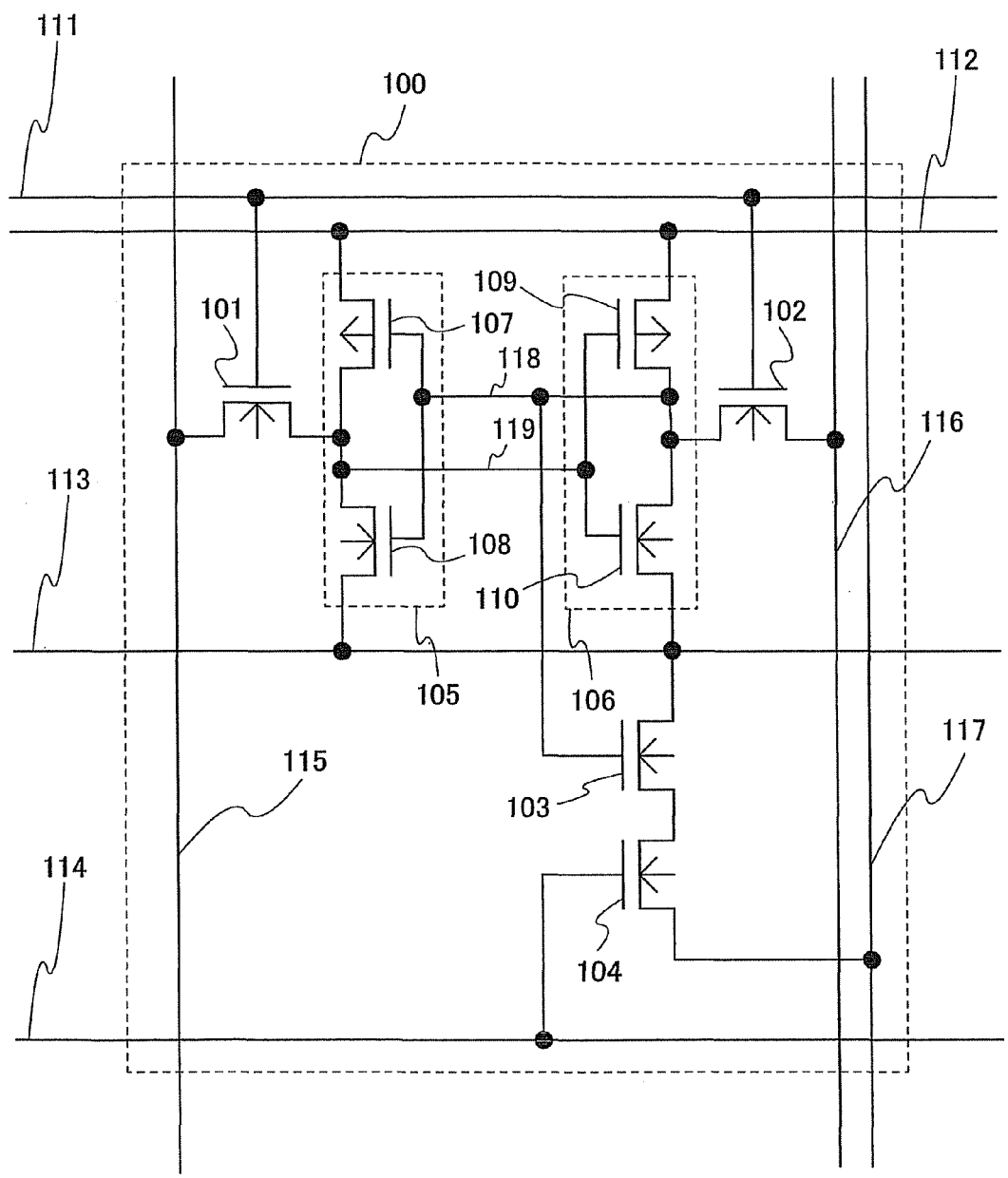
FIG. 1 is a circuit diagram illustrating a structure of a semiconductor memory device of the present invention in Embodiment Mode 1.

Hereinafter, embodiment modes of the present invention will be described with reference to the drawings. However, the present invention can be embodied in many different modes and it is easily understood by those skilled in the art that modes and details can be variously changed without departing from the scope and the spirit of the present invention. Therefore, the present invention should not be limited to the descriptions of the embodiment modes below. In all the drawings used for describing the embodiment modes, the same portions or portions having similar functions may be denoted by the same reference numerals, and the repeated description thereof will be omitted.

Embodiment Mode 1

In this embodiment mode, a structure of a semiconductor memory device which is provided for a semiconductor device of the present invention will be described. Although this embodiment mode shows the case where a power supply voltage is 3 V, the value of the power supply voltage is not limited thereto and other values can be employed.

The semiconductor memory device of the present invention includes a data hold memory cell which has a function of holding data and a memory cell for initialization processing which is for initialization of data which is held in the data hold memory cell.

A structure of the memory cell for initialization processing is shown in FIG. 1. An initialization memory cell 100 includes a first inverter circuit 105 having a first transistor 107 and a second transistor 108, a second inverter circuit 106 having a third transistor 109 and a fourth transistor 110, a fifth transistor 101, a sixth transistor 102, a seventh transistor 103, an eighth transistor 104, a power supply line 112, a ground line 113, a word line 111 which is to be a first word line, a word line 114 which is to be a second word line, a first data line (for writing) 115, a second data line (for writing) 116, and a third data line (for reading) 117.

The second transistor 108, the fourth transistor 110, the fifth transistor 101, the sixth transistor 102, the seventh transistor 103, and the eighth transistor 104 are n-channel transistors. In addition, the first transistor 107 and the third transistor 109 are p-channel transistors.

In the first inverter circuit 105, a first terminal of the first transistor 107 is connected to the power supply line 112. A gate terminal of the second transistor 108 is connected to a gate terminal of the first transistor 107, a first terminal of the second transistor 108 is connected to a second terminal of the first transistor 107, and a second terminal of the second transistor 108 is connected to the ground line 113. In this case, a connection portion of the gate terminal of the first transistor 107, the gate terminal of the second transistor 108, and another element is an input terminal of the first inverter circuit 105. The first terminal of the first transistor 107 is a first potential supply terminal of the first inverter circuit 105. The second terminal of the second transistor 108 is a second potential supply terminal of the first inverter circuit 105. A connection portion of the second terminal of the first transistor 107, the first terminal of the second transistor 108, and another element is an output terminal of the first inverter circuit 105.

In the second inverter circuit 106, a first terminal of the third transistor 109 is connected to the power supply line 112. A gate terminal of the fourth transistor 110 is connected to a gate terminal of the third transistor 109. A first terminal of the fourth transistor 110 is connected to a second terminal of the third transistor 109. A second terminal of the fourth transistor 110 is connected to the ground line 113. In this case, a connection portion of the gate terminal of the third transistor 109, the gate terminal of the fourth transistor 110, and another element is an input terminal of the second inverter circuit 106. The first terminal of the third transistor 109 is a first potential supply terminal of the second inverter circuit 106. The second terminal of the fourth transistor 110 is a second potential supply terminal of the second inverter circuit 106. A connection portion of the second terminal of the third transistor 109, the first terminal of the fourth transistor 110, and another element is an output terminal of the second inverter circuit 106.

The input terminal of the first inverter circuit 105 is connected to the output terminal of the second inverter circuit 106. The output terminal of the first inverter circuit 105 is connected to the input terminal of the second inverter circuit 106.

A gate terminal of the fifth transistor 101 is connected to the word line 111. A first terminal of the fifth transistor 101 is connected to the first data line 115. A second terminal of the fifth transistor 101 is connected to the output terminal of the first inverter circuit 105.

A gate terminal of the sixth transistor 102 is connected to the word line 111. A first terminal of the sixth transistor 102 is connected to the output terminal of the second inverter circuit 106. A second terminal of the sixth transistor 102 is connected to the second data line 116.

A gate terminal of the seventh transistor 103 is connected to the input terminal of the first inverter circuit 105 and the output terminal of the second inverter circuit 106. A first terminal of the seventh transistor 103 is connected to the ground line 113. A connection portion of the gate terminal of the seventh transistor 103, the input terminal of the first inverter circuit 105, and the output terminal of the second inverter circuit 106 is a first node 118. A connection portion of the output terminal of the first inverter circuit 105 and the input terminal of the second inverter circuit 106 is a second node 119.

A gate terminal of the eighth transistor 104 is connected to the word line 114. A first terminal of the eighth transistor 104 is connected to a second terminal of the seventh transistor 103. A second terminal of the eighth transistor 104 is connected to the third data line 117.

Normal data of writing data is input to the first data line 115 and an inverted data of the writing data is input to the second data line 116. That is, when the writing data is 1, data of 1 is input to the first data line 115 and data of 0 is input to the second data line 116. When the writing data is 0, data of 0 is input to the first data line 115 and data of 1 is input to the second data line 116. The third data line 117 is precharged with 3 V by a writing/reading circuit except during data is being read out. Here, the wiring/reading circuit has functions of outputting writing data to the initialization memory cell 100 through the first data line 115 and the second data line 116 and reading out data in a memory cell from a potential of the third data line 117. In the case where a plurality of initialization memory cells is arranged in a line, at least one writing/reading circuit is provided for the memory cells in one line.

Figure 16:
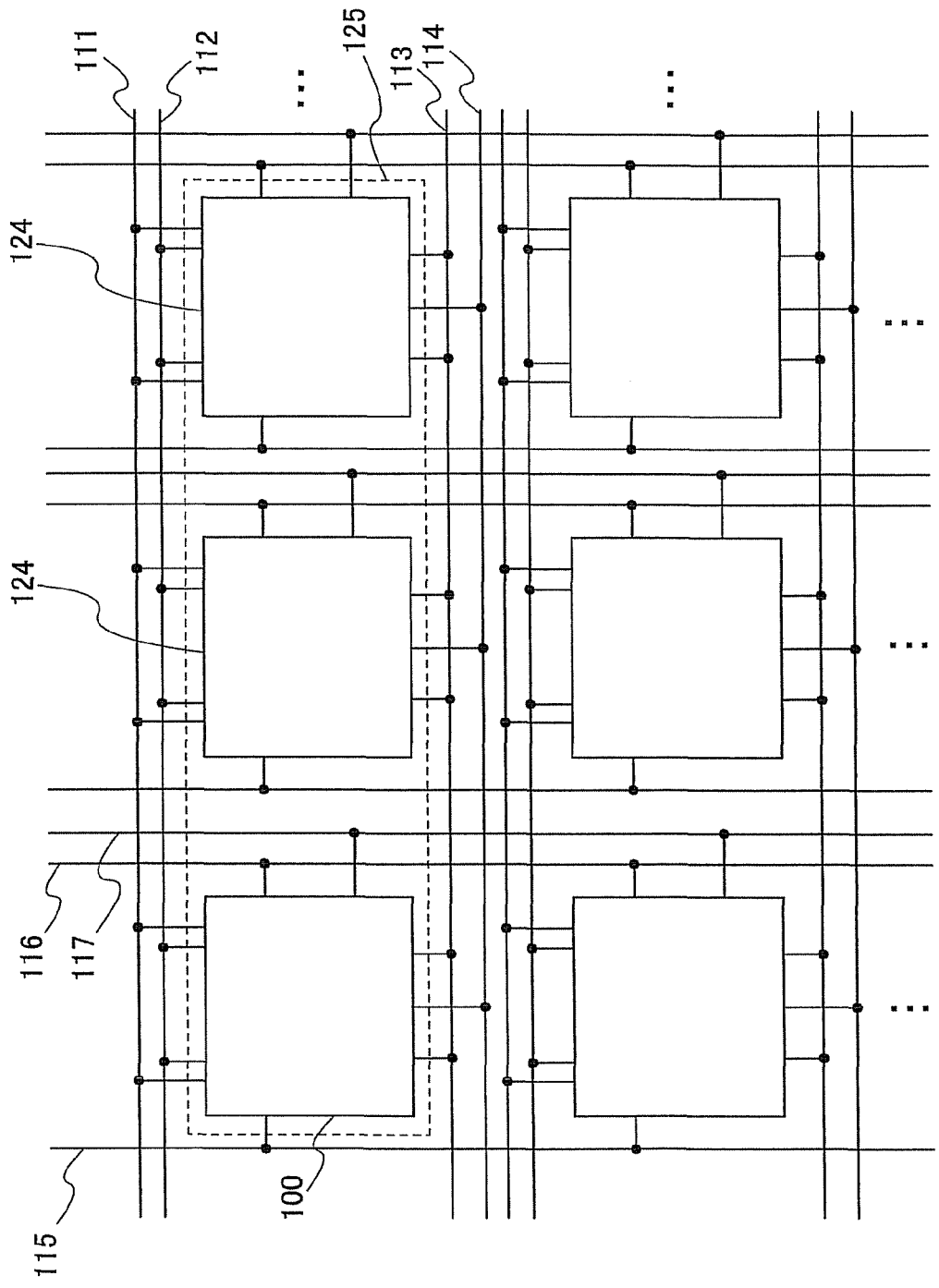
FIG. 16 is a diagram illustrating a structure of a semiconductor memory device of the present invention in Embodiment Mode 1.

Further, the structure of the semiconductor memory device in this embodiment mode will be described with reference to FIG. 16. FIG. 16 illustrates the structure of the semiconductor memory device in this embodiment mode.

As shown in FIG. 16, the semiconductor memory device in this embodiment mode includes a plurality of memory cell groups 125 each including the initialization memory cell 100 and a data hold memory cell 124 which has a function of holding data, a plurality of data lines 115, a plurality of second data lines 116, a plurality of third data lines 117, a plurality of word lines 111, a plurality of word lines 114, a plurality of power supply lines 112, and a plurality of ground lines 113.

Each of the plurality of memory cell groups 125 is connected to the first data line 115, the second data line 116, the third data line 117, the word line 111, the word line 114, the power supply line 112, and the ground line 113.

As a structure of the initialization memory cell 100, the structure shown in FIG. 1 can be applied.

As a circuit configuration of the data hold memory, for example, the structure shown in FIG. 1 can be applied.

Next, operation of the semiconductor memory device in this embodiment mode will be described.

First, operation of the initialization memory cell in a conventional semiconductor device will be described.

In writing data, 3 V is held in the word line 111 and data is written in the initialization memory cell 100 when the fifth transistor 101 and the sixth transistor 102 are turned on.

In reading data, 3 V is held in the word line 114 and the eighth transistor 104 is turned on. In the case where data in the memory cell is 0, when a potential of the first node 118 is 3 V (a potential of the second node 119 is 0 V) and the eighth transistor 104 is turned on, a potential of the third data line 117 which is precharged is made to be 0 V by the seventh transistor 103 and the eighth transistor 104.

In the case where the data in the initialization memory cell 100 is 1, the potential of the third data line 117 which is precharged is kept at 3 V because the potential of the first node 118 is 0 V (the potential of the second node 119 is 3 V) and the seventh transistor 103 is off. The data in the initialization memory cell 100 is held by the first inverter circuit 105 and the second inverter circuit 106. Here, since data of 0 and 1 can be set at will in accordance with a configuration of an external circuit, a reverse case (the case where the data in the initialization memory cell 100 is 0) is also possible. When power supply is off, the memory cell cannot hold the data because the first inverter circuit 105 and the second inverter circuit 106 do not operate. Even after the power supply is turned on, the potential of the first node 118 cannot be identified unless given data is written in the initialization memory cell 100 at least once because the potential of the first node 118 is determined by factors such as a difference between input/output characteristics of the first inverter circuit 105 and the second inverter circuit 106, and wiring capacitance of the first node 118 and the second node 119.

Next, operation of the initialization memory cell of the semiconductor memory device in this embodiment mode will be described.

In the initialization memory cell in this embodiment mode, differences between rising characteristics and between falling characteristics of the first inverter circuit 105 and the second inverter circuit 106 with respect to an input signal are made. However, the initialization memory cell which is connected to each word line holds data of 1 when the data stored in the memory cell is valid, and hold data of 0 when the data stored in the memory cell is invalid. Since whether each word line is valid or invalid can be set at will in accordance with a circuit configuration, a reverse case is also possible. Here, data of 0 is held in the initialization memory cell, and the potential of the first node 118 is 3 V and the potential of the second node 119 is 0 V.

Operation in the case where differences are made between the rising characteristics and between the falling characteristics of the first inverter circuit 105 and the second inverter circuit 106 with respect to an input signal will be described.

When the power supply is off, the first inverter circuit 105 and the second inverter circuit 106 do not operate. The potentials of the first node 118 and the second node 119 are 0 V.

When the power supply is turned on, the first inverter circuit 105 and the second inverter circuit 106 start operating. The potential of the first node 118 is input to the first inverter circuit 105 and the first inverter circuit 105 outputs a potential of the power supply line 112 (also referred to as a power supply potential) or a potential of the ground line 113 (also referred to as a ground potential) to the second node 119. The potential of the second node 119 is input to the second inverter circuit 106 and the second inverter circuit 106 outputs the power supply potential or the ground potential to the first node 118. As described above, the potential of the first node 118 is determined in accordance with a difference between input/output characteristics of the two inverter circuits.

In the initialization memory cell and data hold memory cell used for the conventional semiconductor memory device, two inverter circuits whose transistors have the same size are provided in order to make output current characteristics of the two inverter circuits with respect to an input voltage to be the same with a balance so that writing operation and reading operation can be stably performed by the memory cell. Note that the size of the transistors are determined by a channel length and a channel width.

However, a slight difference of the characteristics can occur in a manufacturing process of the transistors even between two inverter circuits whose transistors have the same size. Since the difference occurs randomly, the characteristics differ between the memory cells. Thus, the data held in the memory cell immediately after the power supply is turned on differs between the memory cells.

However, in the initialization memory cell in the semiconductor memory device of the present invention, the differences are made at will between the rising characteristics and between the falling characteristics of the first inverter circuit 105 and the second inverter circuit 106 with respect to an input signal so that data to be held in the initialization memory cell is determined. For example, the rising characteristic of the third transistor 109 in the second inverter circuit 106 is set to be better than that of the first transistor 107 in the first inverter circuit 105; that is, an absolute value of a threshold voltage of the third transistor 109 is made smaller than that of the first transistor 107. Thus, immediately after the power supply is turned on, the third transistor 109 is turned on faster than the first transistor 107 and can output a larger amount of current, and therefore, the potential of the first node 118 can be 3 V. When the potential of the first node 118 is determined, the potential of the second node 119 is determined to be 0 V by the n-channel transistor in the first inverter circuit 105. In this manner, since the data in the initialization memory cell is made to be 0, initialization processing can be performed at the same time as the power supply is turned on.

Further, at that time, the rising characteristic of the second transistor 108 in the first inverter circuit 105 is made better than that of the fourth transistor 110 in the second inverter circuit 106, that is, the absolute value of a threshold voltage of the second transistor 108 may be made smaller than that of the fourth transistor 110. The potential of the first node, which is changed from 0 V to 3 V, is input to the second transistor 108 immediately after the power supply is turned on. If a rising characteristic of a transistor is good, the transistor is turned on faster and can output a large amount of current. Therefore, the potential of the second node 119, which is being increased to 3 V by the first transistor 107, can be lowered to 0 V. Thus, since the data in the initialization memory cell can be made 0 more certainly, initialization processing can be performed at the same time as the power supply is turned on.

Figure 15:
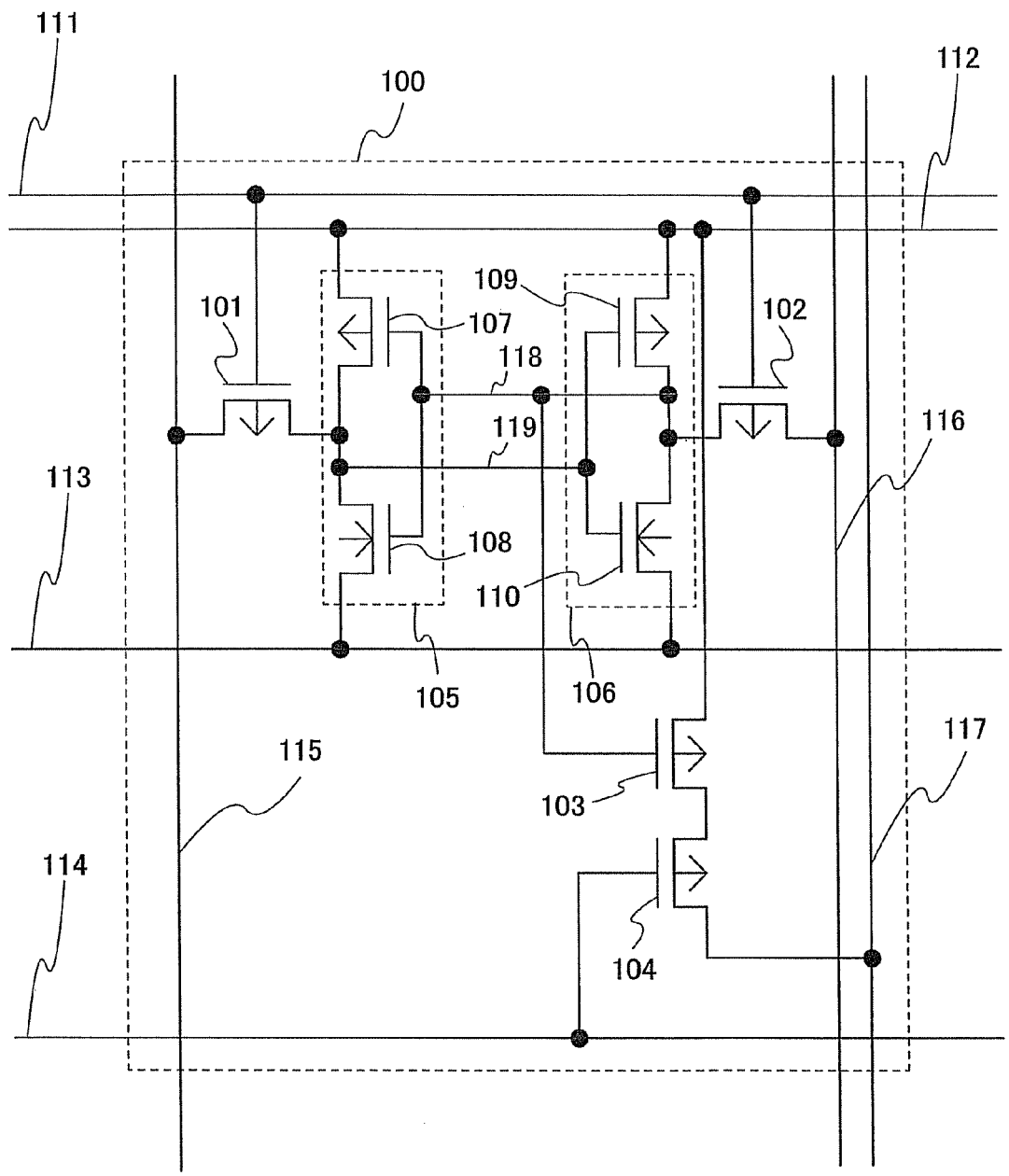
FIG. 15 is a circuit diagram illustrating a structure of a semiconductor memory device of the present invention in Embodiment Mode 1.

Alternatively, as shown in FIG. 15, a structure in which the fifth transistor 101, the sixth transistor 102, the seventh transistor 103, and the eighth transistor 104 are p-channel transistors can be employed. In that case, since each of these transistors in the initialization memory cell employing this structure has opposite conductivity type to each of the transistors shown in FIG. 1, initialization processing can be performed at the same time as the power supply is turned on in a similar manner, by setting a potential applied to each terminal to an opposite value to a potential applied to each terminal shown in FIG. 1. Further, at that time, the third data line 117 is not necessary to be precharged.

Here, a case where a transistor which can make differences between the rising characteristics and between the falling characteristics of the first inverter circuit 105 and the second inverter circuit 106 is employed will be described.

Figure 2:
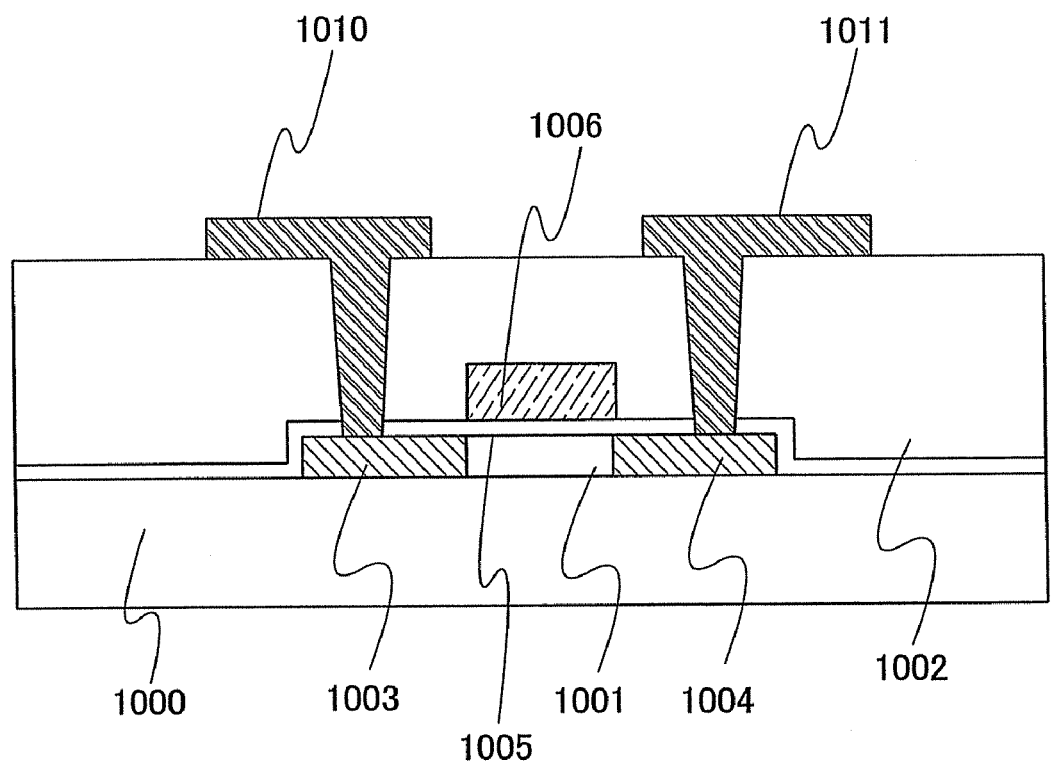
FIG. 2 is a cross-sectional view of an example of a transistor which can be applied to a semiconductor memory device of the present invention in Embodiment Mode 1.

An exemplary structure of the transistor is shown in FIG. 2. The transistor includes a semiconductor layer 1001 provided over a substrate 1000, a gate insulating layer 1005 provided over the semiconductor layer 1001, a gate electrode 1006 provided over the gate insulating layer 1005, an insulating layer 1002 provided over the gate electrode 1006, and a first wiring 1010 and a second wiring 1011 formed over the semiconductor layer 1001 through contact portions provided in the insulating layer 1002. The semiconductor layer 1001 includes a first impurity region 1003 and a second impurity region 1004 to which impurity elements are added.

As the substrate 1000, a glass substrate, a quartz substrate, a metal substrate (e.g., a stainless-steel substrate), a ceramics substrate, or the like can be used. In addition, a plastic substrate can also be used. As a plastic substrate, a substrate made of polyethylene terephthalate (PET), polyethylene naphthalate (PEN), polyethersulfone (PES), acrylic, or the like can be used.

Moreover, the gate insulating layer 1005 and the insulating layer 1002 each can be formed of any one or a plurality of silicon oxide, silicon nitride, silicon oxynitride, and silicon nitride oxide. Further, the gate insulating layer 1005 and the insulating layer 1002 each can be formed with a stacked-layer structure of selected materials from the above mentioned materials. The gate insulating layer 1005 and the insulating layer 1002 can be formed by CVD, sputtering, or the like.

Further, the semiconductor layer 1001 can be formed of amorphous silicon, polycrystalline silicon, microcrystalline silicon (also referred to as semi-amorphous silicon), or the like. Furthermore, the semiconductor layer 1001 can be formed by sputtering, LPCVD, plasma CVD, or the like.

Furthermore, the semiconductor layer 1001 is irradiated with a laser beam to be crystallized. Note that the semiconductor layer 1001 can also be crystallized by a method in which laser beam irradiation, thermal crystallization using RTA or an annealing furnace, and thermal crystallization using a metal element which promotes crystallization are combined, or the like. After that, the obtained crystalline semiconductor film is etched into a desired shape so that the semiconductor layer 1001 is formed.

As a laser beam used for crystallization, either a continuous wave laser (a CW laser) or a pulsed laser can be used. As a laser beam that can be used here, one or more of laser beams emitted from the followings can be given: a gas laser such as an Ar laser, a Kr laser, or an excimer laser; a laser whose medium is a single-crystal YAG; YVO$_4$, forsterite (Mg$_2$SiO$_4$), YAlO$_3$, or GdVO$_4$ or a polycrystalline (ceramic) YAG, Y$_2$O$_3$, YVO$_4$, YAlO$_3$, or GdVO$_4$, each of which is doped with one or more of Nd, Yb, Cr, Ti, Ho, Er, Tm, and Ta; a glass laser; a ruby laser; an alexandrite laser; a Ti:sapphire laser; a copper vapor laser; and a gold vapor laser. When irradiation is conducted with the fundamental wave of such a laser beam or the second to fourth harmonics of the fundamental wave, crystals with a large grain size can be obtained. For example, the second harmonic (532 nm) or the third harmonic (355 nm) of an Nd:YVO$_4$ laser (fundamental wave of 1064 nm) can be used. In this case, a laser power density of about greater than or equal to 0.01 MW/cm$^2$ and less than or equal to 100 MW/cm$^2$ (preferably, greater than or equal to 0.1 MW/cm$^2$ and less than or equal to 10 MW/cm$^2$) is required, and irradiation is conducted with a scanning rate of about greater than or equal to 10 cm/sec and less than or equal to 2000 cm/sec. A laser whose medium is a single-crystal YAG, YVO$_4$, forsterite (Mg$_2$SiO$_4$), YAlO$_3$, or GdVO$_4$ or a polycrystalline (ceramic) YAG, Y$_2$O$_3$, YVO$_4$, YAlO$_3$, or GdVO$_4$, each of which is doped with one or more of Nd, Yb, Cr, Ti, Ho, Er, Tm, and Ta; an Ar ion laser; or a Ti:sapphire laser can function as a CW laser and can also function as a pulsed laser with a repetition rate of 10 MHz or higher by mode locking. When a laser beam is oscillated with a repetition rate of 10 MHz or higher, a semiconductor film is irradiated with a pulsed laser beam after the semiconductor layer is melted by the previous laser beam and before the melted semiconductor film is solidified. Therefore, unlike a pulsed laser with low repetition rate, an interface between a solid phase and a liquid phase can be moved continuously in the semiconductor layer, whereby crystal grains grown continuously toward a direction where the laser beam is moved can be obtained In order to form a semiconductor layer having a crystalline structure, a method in which thermal treatment is performed on an amorphous semiconductor layer can also be employed. In the case where a heating furnace is used for the thermal treatment, an amorphous silicon layer is heated at 400 to 550° C. for 2 to 20 hours.

In the thermal treatment step, a metal which promotes crystallization of a semiconductor layer, such as nickel, is added thereto. A solution containing nickel is applied to the amorphous silicon layer and thermal treatment is performed thereon, whereby a heating temperature can be lowered and a polycrystalline silicon layer having a continuous grain boundary can be obtained. Here, as the metal which promotes crystallization, iron, ruthenium, rhodium, palladium, osmium, iridium, platinum, copper, or the like can be used as well as nickel.

Since the metal which promotes crystallization becomes a contaminant source, a gettering step for removing metal is preferably performed after the amorphous silicon layer is crystallized. In the gettering step, after the amorphous silicon layer is crystallized, a layer which is to be a gettering sink is formed over the silicon layer, and the silicon layer is heated so that the metal is moved into the gettering sink when the silicon layer is heated. As the gettering sink, a polycrystalline semiconductor layer or a semiconductor layer to which impurities are added can be used. For example, a polycrystalline silicon layer to which an inert element such as argon is added is formed over the silicon layer to be used as the gettering sink. When the inert element is added to the gettering sink, a strain is generated and the metal can be captured more efficiently. Alternatively, the metal can be captured by addition of an element such as phosphorus to part of the semiconductor layer in the transistor, without forming the gettering sink.

The gate electrode 1006 can be formed by using an element selected from tantalum, tungsten, titanium, molybdenum, aluminum, copper, chromium, niobium, or the like, or an alloy material or compound material containing any of the elements as its main component. Alternatively, a semiconductor material typified by polycrystalline silicon which is doped with an impurity element such as phosphorus can be used. Further, a stacked-layer structure of one or a plurality of materials selected from those listed above can also be employed. Examples of a combination of the materials listed above includes a tantalum nitride film and a tungsten film, a tungsten nitride film and a tungsten film, a molybdenum nitride film and a molybdenum film, and the like. Since tungsten and tantalum nitride have high heat resistance, thermal treatment for thermal activation can be performed after a first layer and a second layer of the gate electrode are formed. Alternatively, not only a two-layer structure but also a three-layer structure can be employed. In the case of the three-layer structure, for example, a stacked-layer structure of a molybdenum film, an aluminum film, and a molybdenum film can be employed.

The first impurity region 1003 and the second impurity region 1004 can be formed by adding an impurity element to part of the semiconductor layer 1001. If the impurity element is desired to be added to a predetermined region, a resist is formed and the impurity element is added using the resist as a mask, whereby each of the first impurity region 1003 and the second impurity region 1004 containing a desired element in a desired region can be formed. Note that as the impurity element, phosphorus or boron can be used.

As the insulating layer 1002, one or more of an inorganic material such as oxide of silicon or nitride of silicon; an organic material such as polyimide, polyamide, benzocyclobutene, acrylic, or epoxy; and a siloxane material can be used. Further, a stacked-layer structure of one or a plurality of materials selected from those listed above can also be employed.

Each of the first wiring 1010 and the second wiring 1011 functions as a source wiring and a drain wiring, and each can be formed from an element selected from aluminum, tungsten, titanium, tantalum, molybdenum, nickel, platinum, copper, gold, silver, manganese, neodymium, carbon, or silicon, or an alloy material or compound material containing any of the elements as its main component listed above. Further, a stacked-layer structure of one or a plurality of materials selected from those listed above can also be employed. As an alloy material containing aluminum as its main component, for example, a material containing aluminum as its main component and also nickel, or an alloy material containing aluminum as its main component, nickel, and one or both of carbon and silicon, or the like can be used. The first wiring 1010 and the second wiring 1011 may employ, for example, a stacked layer structure of a barrier film, an aluminum-silicon (Al—Si) film, and a barrier film, or a stacked layer structure of a barrier film, an aluminum-silicon (Al—Si) film, a titanium nitride film, and a barrier film. It is to be noted that a barrier film corresponds to a thin film formed by using titanium, a nitride of titanium, molybdenum, or a nitride of molybdenum. Aluminum and aluminum silicon which have low resistance and are inexpensive are optimal materials for forming the first wiring 1010 and the second wiring 1011. In addition, generation of a hillock of aluminum or aluminum silicon can be prevented when upper and lower barrier layers are formed. Furthermore, when the barrier film is formed by using titanium that is a highly-reducible element, even if a thin natural oxide film is formed over the crystalline semiconductor film, the natural oxide film can be reduced so that preferable contact with the crystalline semiconductor film can be obtained.

Either the first impurity region 1003 and the first wiring 1010, or the second impurity region 1004 and the second wiring 1011 functions as either a source terminal or a drain terminal. A channel-forming region is formed between the first impurity region 1003 and the second impurity region 1004.

Although, a staggered transistor is illustrated in this embodiment mode, the present invention is not limited thereto. An inversely staggered transistor can also be employed.

Further, as a transistor, a transistor using a single-crystal semiconductor film can be used. The transistor using a single crystal is shown in FIG. 3.

Figure 3:
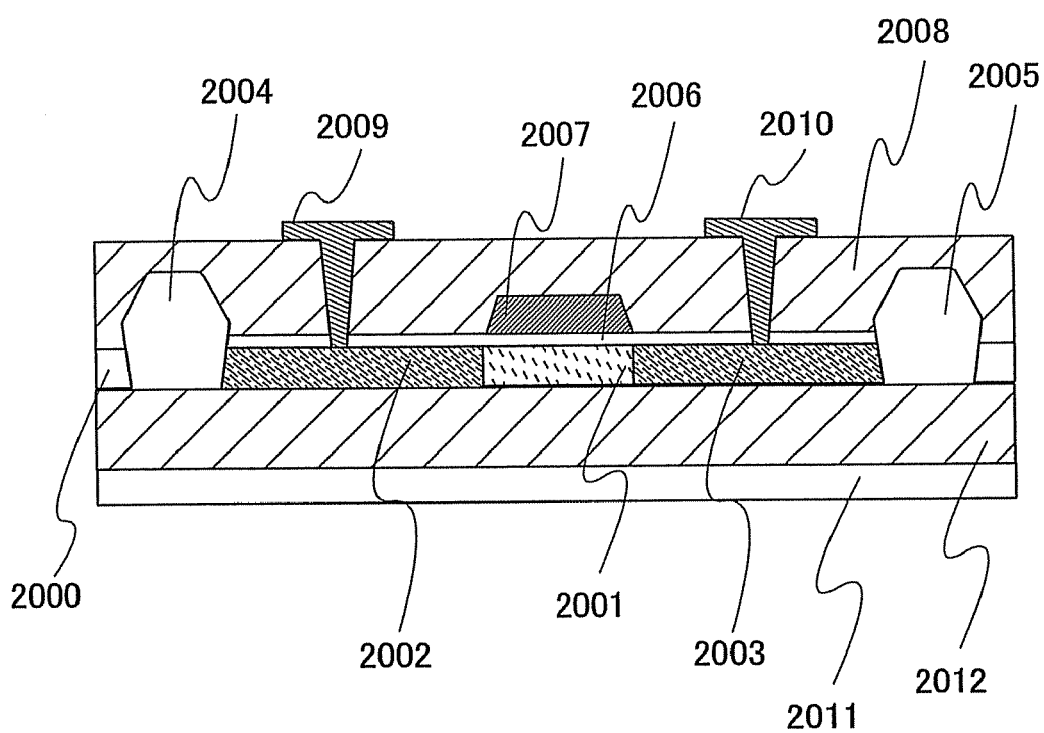
FIG. 3 is a cross-sectional view of an example of a transistor which can be applied to a semiconductor memory device of the present invention in Embodiment Mode 1.

As shown in FIG. 3, the transistor using a single crystal includes a substrate 2011 which is formed of silicon or the like, an insulating layer 2012, a semiconductor substrate 2000, a gate insulating layer 2006 formed over the semiconductor substrate 2000, and a gate electrode 2007 formed over the gate insulating layer 2006. The semiconductor substrate 2000 includes a first insulating layer 2004, a second insulating layer 2005, and a well region 2001. The well region 2001 includes a first impurity region 2002 and a second impurity region 2003. The gate insulating layer 2006 and the gate electrode 2007 are formed over a region between the first impurity region 2002 and the second impurity region 2003 in the semiconductor substrate 2000. Further, an insulating layer 2008 is formed over the gate electrode 2007 and the semiconductor substrate 2000. The given number of contact portions are provided in parts of the insulating layer 2008, and a first wiring 2009 and a second wiring 2009 are formed over the first impurity region 2002 and the second impurity region 2003, respectively, through the contact portions.

As the semiconductor substrate 2000, for example, a single-crystal silicon substrate having a n-type or p-type conductivity or a compound semiconductor substrate (a GaAs substrate, an InP substrate, a GaN substrate, an SiC substrate, a sapphire substrate, a ZnSe substrate, or the like) can be used.

In order to form the first insulating layer 2004 and the second insulating layer 2005, a selective oxidation method (a LOCOS (local oxidation of silicon) method), a trench isolation method, or the like can be used.

As the gate electrode 2007, tantalum, tungsten, titanium, molybdenum, aluminum, copper, chromium, niobium, or the like can be used. Alternatively, the gate electrode 2007 can be formed using a film formed of an alloy or a compound containing any of the metals as its main component can be used. Alternatively, the gate electrode 2007 can be formed of a semiconductor such as polycrystalline silicon doped with an impurity element which imparts a conductivity type to a semiconductor film, such as phosphorus. Further, the gate electrode 2007 can be formed by being patterned (patterning or the like) into a predetermined shape.

The well region 2001, the first impurity region 2002, and the second impurity region 2003 can be formed by addition of an impurity element. As the impurity element, an impurity element imparting n-type or p-type conductivity is used. As an impurity element imparting n-type conductivity, phosphorus, arsenic, or the like can be used. As an impurity element imparting p-type conductivity, boron, aluminum, gallium, or the like can be used. If the impurity element is desired to be added to a predetermined region, a resist is formed and the impurity element is added using the resist as a mask, whereby the well region 2001, the first impurity region 2002, and the second impurity region 2003 each containing a desired element can be formed in the predetermined regions.

The gate insulating layer 2006 can be formed using an inorganic material, an organic material, or a mixed material of an organic material and an inorganic material. For example, a film containing silicon oxide, silicon oxynitride, silicon nitride oxide, or carbon typified by DLC (diamond like carbon), acrylic, epoxy, polyimide, polyamide, polyvinylphenol, benzocyclobutene, or the like can be used. In addition, the first insulating layer 2004 and the second insulating layer 2005 can be formed by a CVD method, a sputtering method, a droplet discharging method, or a printing method in accordance with a material thereof.

Either the first impurity region 2002 and the first wiring 2009, or the second impurity region 2003 and the second wiring 2010 functions as either a source terminal or a drain terminal. A channel-forming region is formed between the first impurity region 2002 and the second impurity region 2003.

In the case where the transistor shown in FIG. 2 or FIG. 3 is used, it is possible to make differences between rising characteristics and between falling characteristics of the first inverter circuit 105 and the second inverter circuit 106 by changing the thickness of a semiconductor layer of any transistor included in the first inverter circuit 105 and the second inverter circuit 106.

Figure 4:
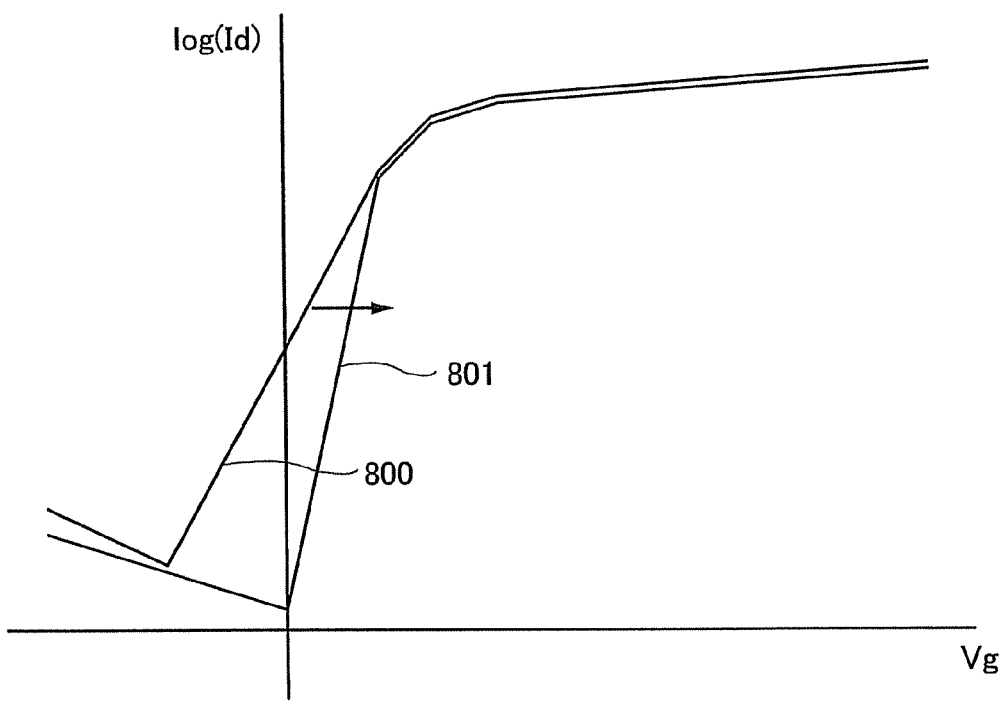
FIG. 4 is a diagram showing threshold voltages with respect to a difference in thickness of semiconductors layer of transistors which can be applied to a semiconductor memory device of the present invention.

A relationship between the thickness of a semiconductor layer and a rising characteristic of a transistor has been generally said as follows. Transistors have short-channel effect in which a threshold voltage is decreased when a channel length is shortened. As a method for suppressing the short-channel effect, a method in which the thickness of the semiconductor layer is reduced can be given. In general, it is said that a semiconductor layer which is quarter to half the channel length in thickness is necessary in order to suppress the short-channel effect. Even if one transistor has short-channel effect although the transistor has a thickness which is within the above-described range, the transistor can be employed by further reducing the thickness of another transistor beyond the above-described range of the thickness to make the other transistor have a thickness which prevents short-channel effect more certainly. A relationship between a film thickness and a threshold voltage of an n-channel transistor is shown in FIG. 4. A horizontal axis represents a voltage $V_g$ between a gate terminal and a source terminal and a vertical axis represents a current $I_d$ which flows between a drain terminal and the source terminal. Compared to a characteristic curve 801 in the case where the thickness of the semiconductor layer is within a range of causing no short-channel effect, a characteristic curve 800 in the case where the thickness of the semiconductor layer is within a range of causing short-channel effect shows a decrease in the threshold voltage. When short-channel effect occurs, a leakage current increases when $V_g=0$ V. In that case, the threshold voltage can be further decreased by adjusting the dope amount of an impurity element in a channel portion so that a current consumption can be reduced.

According to the above description, the rising characteristics of the transistor can be changed by changing the thickness of the semiconductor layer. Therefore, in this embodiment mode, differences between rising characteristics and between falling characteristics of one transistor in the first inverter circuit 105 and one transistor in the second inverter circuit 106, having conductivity which is the same as that of the one transistor in the first inverter circuit 105 can be made by changing the thicknesses of the semiconductor layers of the transistors which are to have the differences from each other.

Further, although the case where the thicknesses of the semiconductor layers in respective transistors are made different from each other is described in this embodiment mode, the present invention is not limited thereto. For example, also in the case where the thicknesses of the gate insulating films are made different from each other, the rising characteristics of transistors can be different from each other. Specifically, the rising characteristic of the transistor is improved when the thickness of the gate insulating film is made thinner. For example, in this embodiment mode, rising characteristics and falling characteristics of one transistor in the first inverter circuit 105 and one transistor in the second inverter circuit 106 which has the same conductivity as that of the one transistor in the first inverter circuit 105 can be made different from each other when the gate insulating layer of the one transistor in the second inverter circuit 106 made thinner than that of the one transistor in the first inverter circuit 105.

In this manner, by making a difference between the absolute values of threshold voltages of transistors in the first inverter circuit 105 and the second inverter circuit 106, differences between rising characteristics and between falling characteristics of the first inverter circuit 105 and the second inverter circuit 106 can be made so that the potentials of the first node 118 and the second node 119 can be determined more quickly.

Further, with reference to FIG. 5, a structure will be described in which a separate circuit element is provided to each of the memory cell groups 125 (also referred to as a memory line) which includes the initialization memory cell 100 shown in FIG. 1 and the data hold memory cell 124, in order to control the potentials of the first node 118 and the second node 119 at the time when power supply is turned from L to H and to perform initialization process more certainly.

Figure 5:
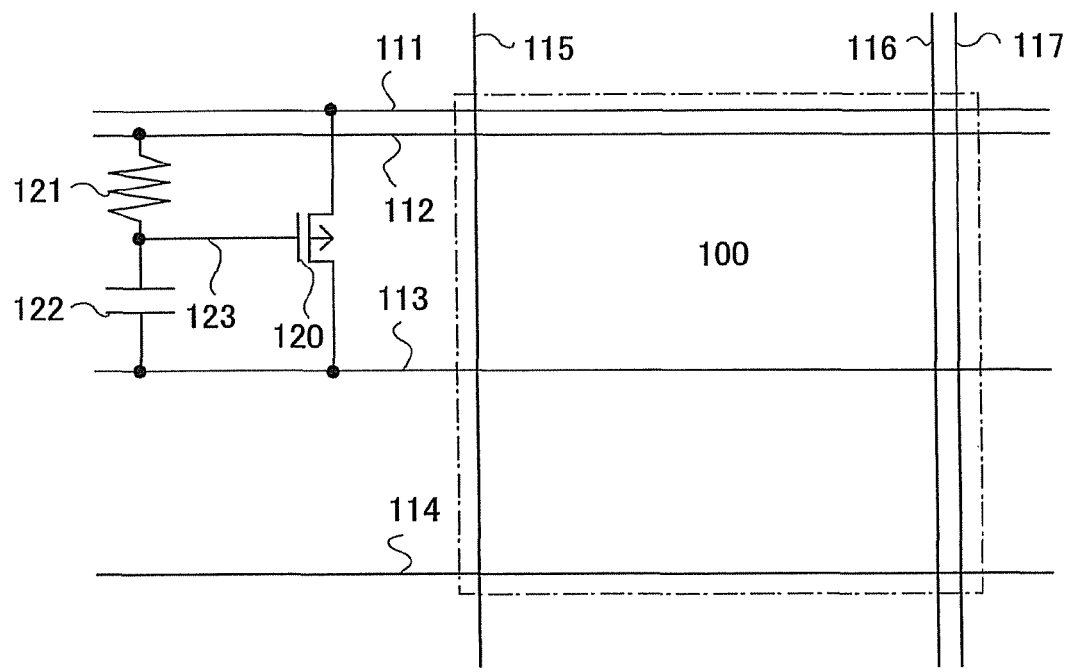
FIG. 5 is a circuit diagram illustrating another structure of a semiconductor memory device of the present invention in Embodiment Mode 1.

The structure of the initialization memory cell in FIG. 5 includes the initialization memory cell 100 shown in FIG. 1, a ninth transistor 120, a resistor element 121, and a capacitor element 122.

A gate terminal of the ninth transistor 120 is connected to the power supply line 112 through the resistor element 121 and to the ground line 113 through the capacitor element 122, a first terminal of the ninth transistor 120 is connected to the word line 111, and a second terminal of the ninth transistor 120 is connected to the ground line 113. A connecting wiring of the gate terminal of the ninth transistor 120, the resistor element 121, and the capacitor element 122 is a wiring 123. Note that the ninth transistor 120 is a p-channel transistor.

Figure 6:
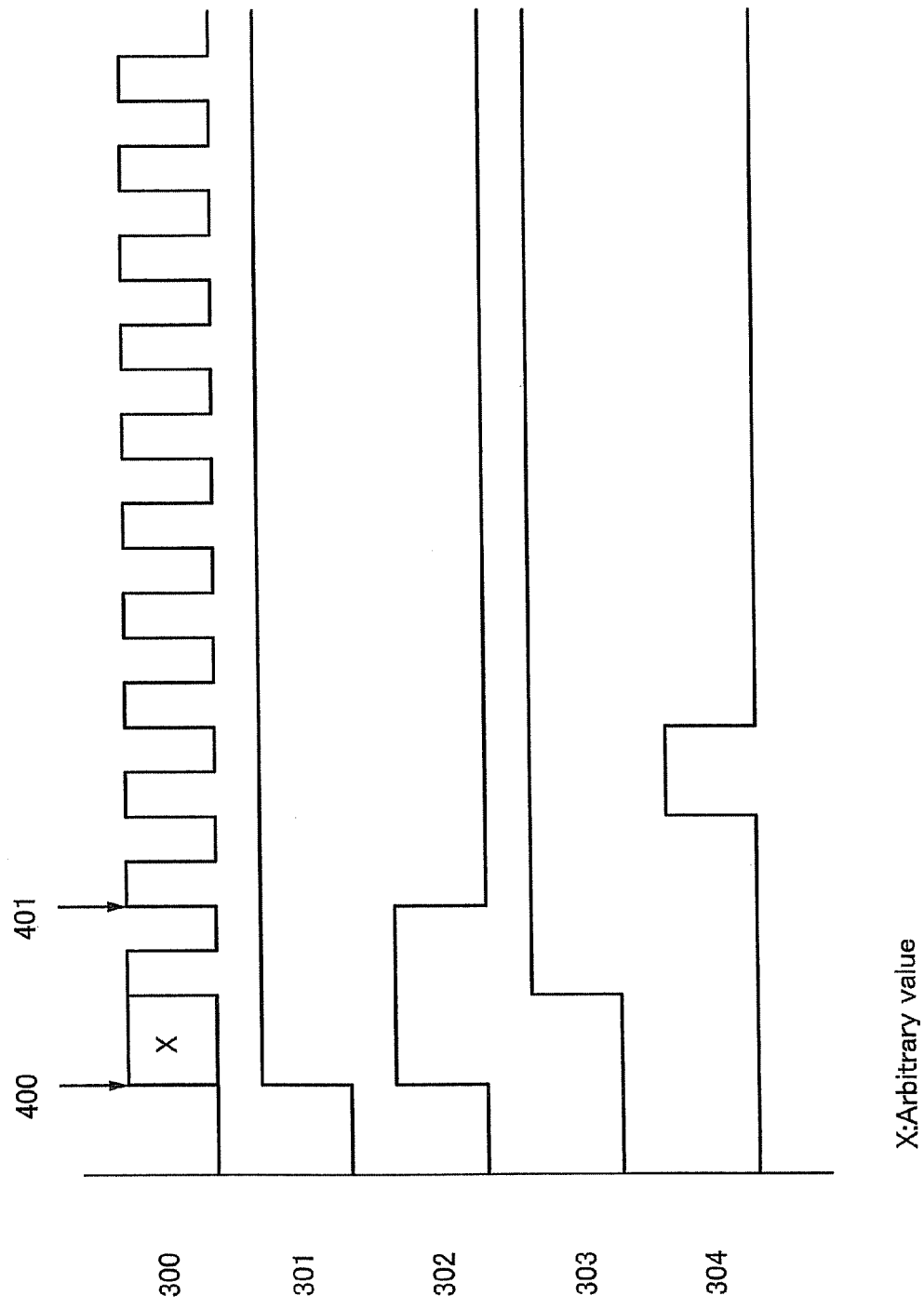
FIG. 6 is a timing chart showing operation of a semiconductor memory device of the present invention in Embodiment Mode 1.

Operation with the above-described structure will be described with reference to a timing chart in FIG. 6. In FIG. 6, a clock signal is denoted by a signal 300, a power supply voltage is denoted by a power supply voltage 301, a reset signal is denoted by a signal 302, a signal of the wiring 123 is denoted by a signal 303, and an access signal from outside such as a CPU is denoted by a signal 304. When power supply is turned on and a power supply voltage is turned from L to H, at an event timing 400 in the signal 300, all the memory cells are invalidated by the structure of the initialization memory cell shown in FIG. 5. When the power supply is turned on, the signal 303 is turned from L to H at the same time, held in that state for a certain period, and turned to L thereafter. Each circuit performs reset operation while the signal 302 is H. The signal 303 is turned from L to H a little later than turning-on of the power supply. Amount of the resistor element 121 and the capacitor element 122 can determine how long the signal 303 is to be delayed from turning-on of the power supply.

Since a potential of the word line 111 changes from a ground potential to another potential when the signal 303 is turned from L to H, the signal 303 may be set to be turned from L to H during a reset operation period. After the signal 302 is turned to L, the reset operation is over at an event timing 401 in the signal 300 and a pulse of the signal 304 is input so that access to an external circuit starts.

The structure makes it possible for all the initialization memory cells to perform invalidation process more certainly at the same time as power supply is turned on. Therefore, data can be initialized at higher speed.

The structure shown in FIG. 15 can also perform similar operation by connecting the first terminal of the ninth transistor 120 to the power supply line 112 in the circuit configuration shown in FIG. 5.

Figure 7:
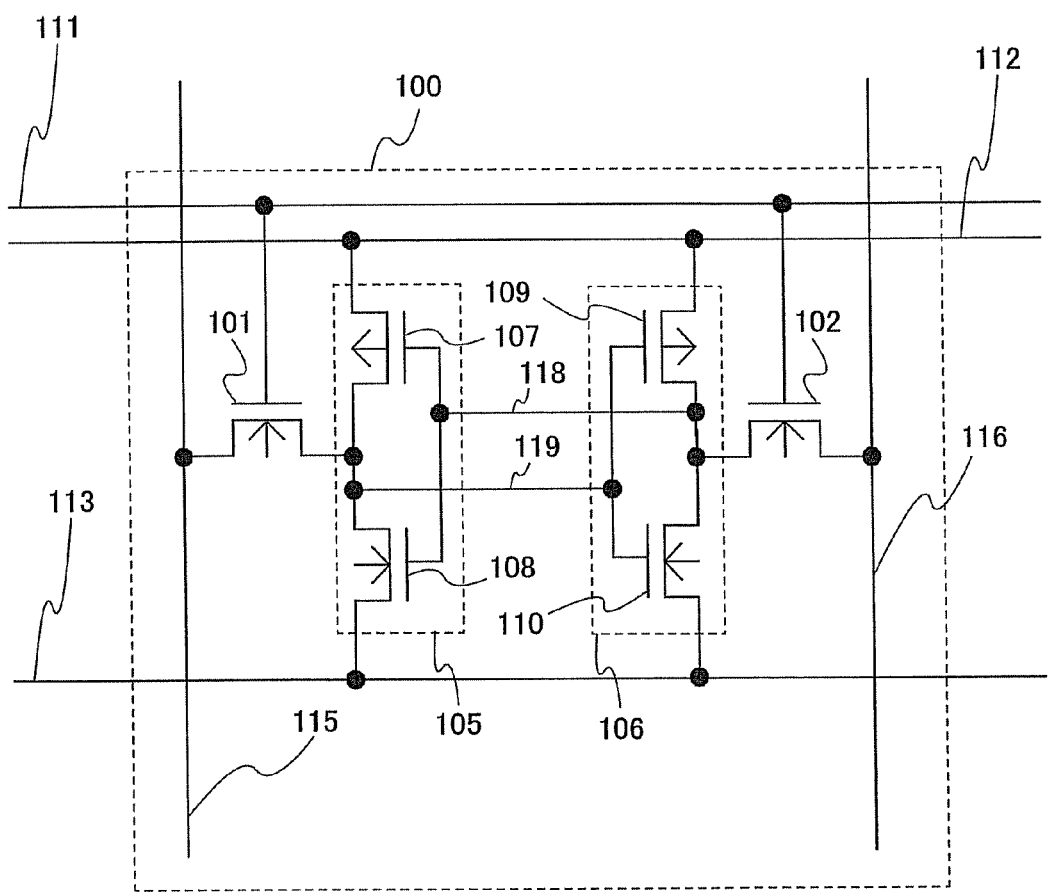
FIG. 7 is a circuit diagram illustrating another structure of a semiconductor memory device of the present invention in Embodiment Mode 1.

In addition, in this embodiment mode, a structure of an initialization memory cell shown in FIG. 7 can also be employed.

As compared with the structure shown in FIG. 1, the structure shown in FIG. 7 does not include the third data line 117, the word line 114, the seventh transistor 103, and the eighth transistor 104.

Figure 17:
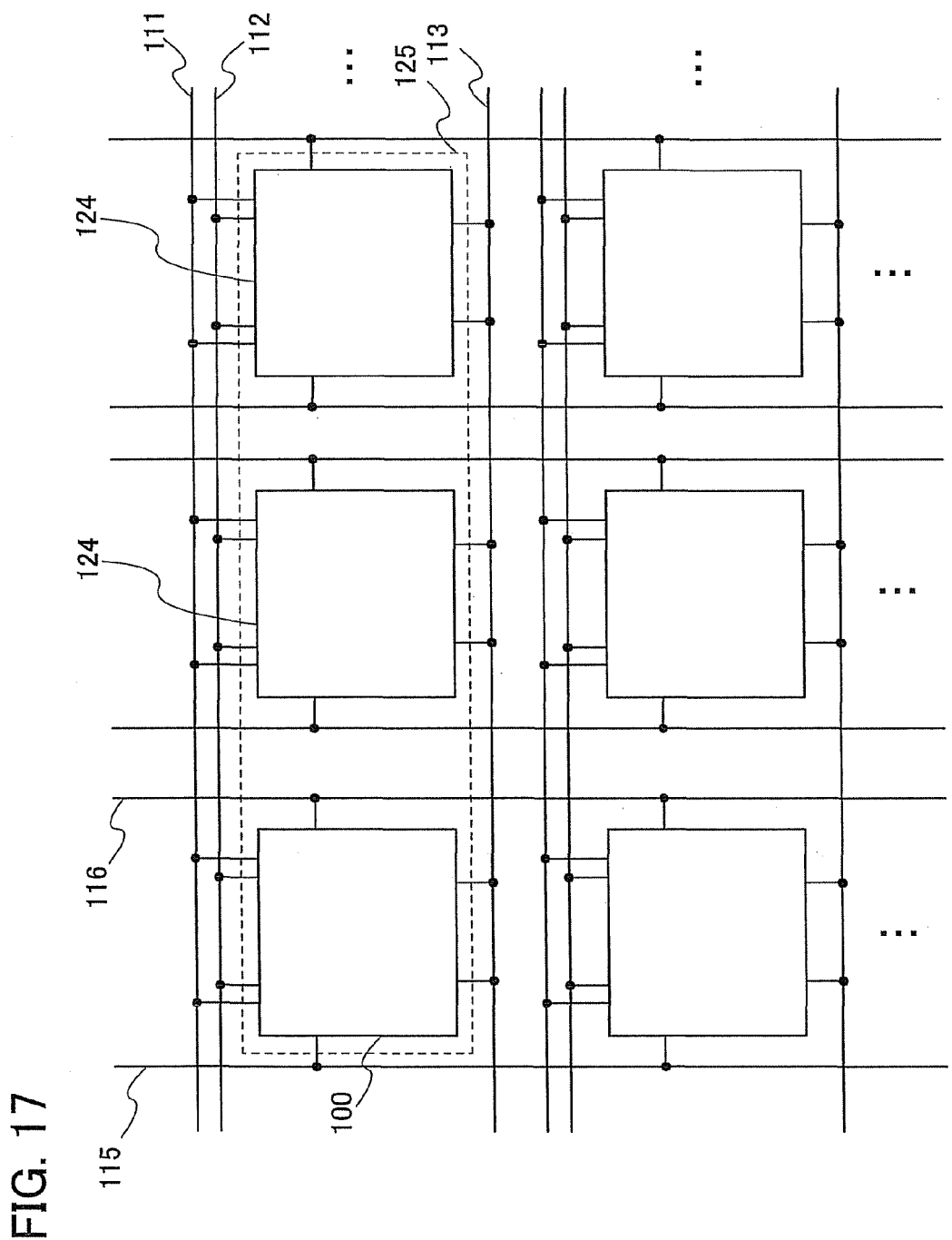
FIG. 17 is a diagram illustrating a structure of a semiconductor memory device of the present invention in Embodiment Mode 1.

FIG. 17 illustrates a case where the structure of the memory cell shown in FIG. 7 is applied to the semiconductor device in this embodiment mode. As shown in FIG. 17, the semiconductor memory device in this embodiment mode includes the plurality of memory cell groups 125 including the initialization memory cell 100 and the data hold memory cell 124 which has a function of holding data, the plurality of first data lines 115, the plurality of second data lines 116, the plurality of third data lines 117, the plurality of word lines 111, the plurality of power supply lines 112, and the plurality of ground lines 113

Each memory cell in the plurality of memory cell groups 125 is connected to the first data line 115, the second data line 116, the third data line 117, the word line 111, the power supply line 112, and the ground line 113.

As the initialization memory cell 100, for example, the structure shown in FIG. 7 can be applied.

As a circuit configuration of the data hold memory cell 124, for example, the structure shown in FIG. 7 can be applied.

Although not shown, circuit configurations of the initialization memory cell and the data hold memory cell can be different from each other. For example, one of the initialization memory cell and the data hold memory cell may have the circuit configuration shown in FIG. 1, and the other thereof may have the circuit configuration shown in FIG. 7.

With the structure shown in FIG. 7, the area of the memory cell can be smaller than that of the memory cell in FIG. 1. Note that the structure shown in FIG. 7 can be applied to the memory cell 124 in FIG. 16. As for the operation, data writing operation is performed in the same manner as in FIG. 1, though data reading operation is performed in a different manner. The reading operation will be specifically described. First, 3 V is held in the word line 111, and the fifth transistor 101 and the sixth transistor 102 are turned on. A potential of the first data line 115 becomes the same as that of the second node 119, and a potential of the second data line 116 becomes the same as that of the first node 118. Thus, the writing/reading circuit detects the potentials of the first node 118 and the second node 119. Here, in the case where the data in the memory cell is 0, since the potential of the first node 118 is 3 V (the potential of the second node 119 is 0 V), the potential of the second data line 116 is 3 V (the potential of the first data line 115 is 0 V).

On the other hand, in the case where the data in the memory cell is 1, since the potential of the first node 118 is 0 V (the potential of the second node 119 is 3 V), the potential of the second data line 116 is 0 V (the potential of the first data line 115 is 3 V).

Further, in this embodiment mode, if data "0" is held when the data stored in the memory cell is valid, and data "1" is held when the data stored in the memory cell is invalid, a rising characteristic of the first transistor 107 in the first inverter circuit 105 is improved, that is, the first transistor 107 is turned on faster. Further, by improving a rising characteristic of the fourth transistor 110 in the second inverter circuit 106, initialization processing can be automatically performed at the same time as power supply is turned on.

In this manner, by changing threshold values of the transistors in the first inverter circuit 105 and the second inverter circuit 106, differences between rising characteristics and between falling characteristics of the first inverter circuit 105 and the second inverter circuit 106 can be made and the potentials of the first node 118 and the second node 119 can be determined more quickly.

In addition, by applying the initialization memory cell of this embodiment mode to a semiconductor memory device, initialization of data in initialization processing in each memory cell can be performed at high speed.

Embodiment Mode 2

In this embodiment mode, as another example of the method for making differences between rising characteristics and between falling characteristics of the first inverter circuit 105 and the second inverter circuit 106, a structure in which a threshold voltage of some transistors is changed will be described.

Figure 8:
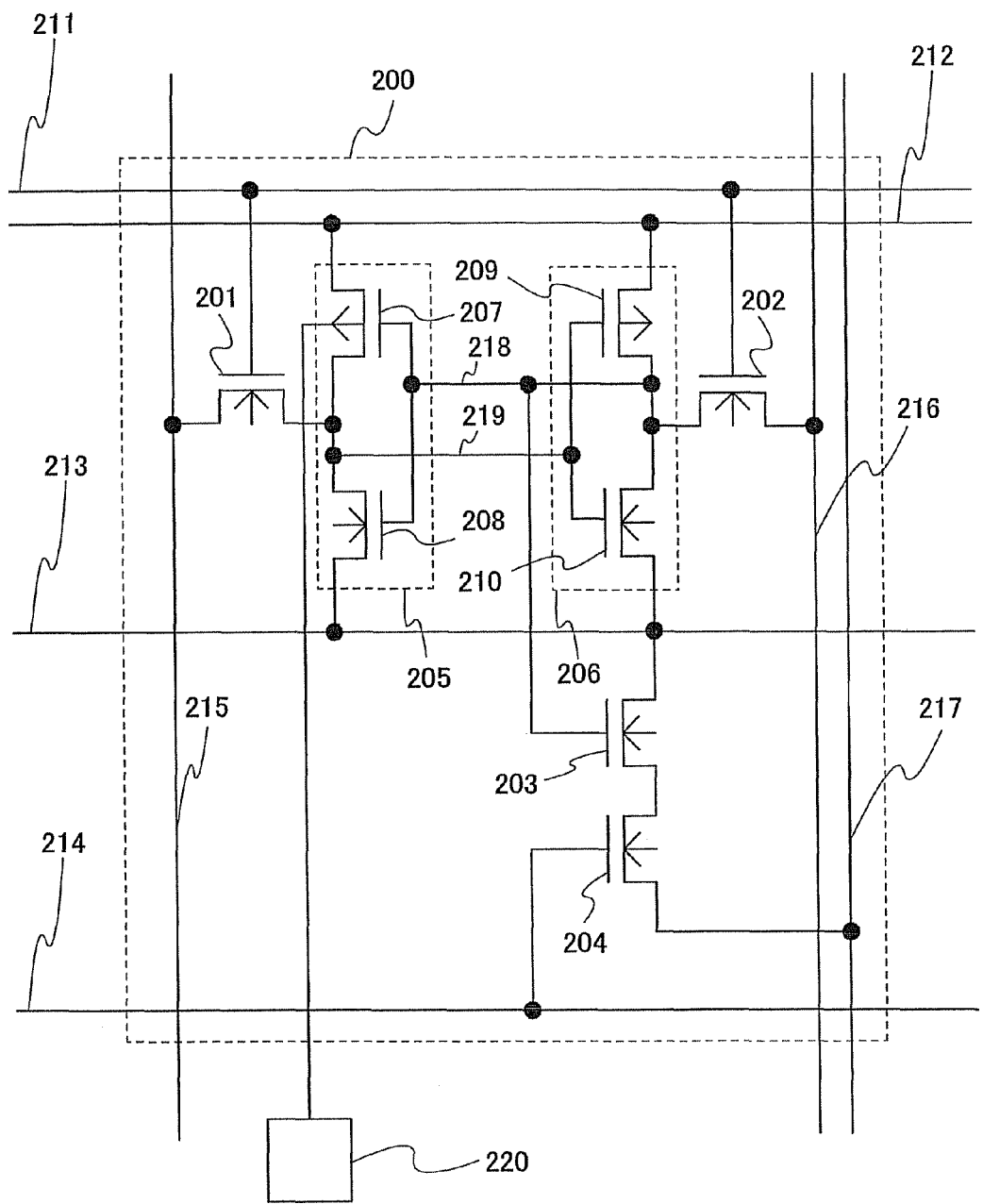
FIG. 8 is a circuit diagram illustrating a structure of a semiconductor memory device of the present invention in Embodiment Mode 2.

A structure of an initialization memory cell in a semiconductor memory device of this embodiment mode is shown in FIG. 8.

A memory cell 200 for initialization processing includes a first inverter circuit 205 having a first transistor 207 and a second transistor 208, a second inverter circuit 206 having a third transistor 209 and a fourth transistor 210, a fifth transistor 201, a sixth transistor 202, a seventh transistor 203, an eighth transistor 204, a power supply line 212, a ground line 213, a word line 211 which is to be a first word line, a word line 214 which is to be a second word line, a first data line 215, a second data line 216, a third data line 217, and a bias circuit 220.

The second transistor 208, the fourth transistor 210, the fifth transistor 201, the sixth transistor 202, the seventh transistor 203, and the eighth transistor 204 are n-channel transistors. Further, the first transistor 207 and the third transistor 209 are p-channel transistors.

In the first inverter circuit 205, a first terminal of the first transistor 207 is connected to the power supply line 212. A gate terminal of the second transistor 208 is connected to a gate terminal of the first transistor 207, a first terminal of the second transistor 208 is connected to a second terminal of the first transistor 207, and a second terminal of the second transistor 208 is connected to the ground line 213. In this case, a connection portion of the gate terminal of the first transistor 207, the gate terminal of the second transistor 208, and another element is an input terminal of the first inverter circuit 205. The first terminal of the first transistor 207 is a first potential supply terminal of the first inverter circuit 205. The second terminal of the second transistor 208 is a second potential supply terminal of the first inverter circuit 205. A connection portion of the second terminal of the first transistor 207, the first terminal of the second transistor 208, and another element is an output terminal of the first inverter circuit 205.

In the second inverter circuit 206, a first terminal of the third transistor 209 is connected to the power supply line 212. A gate terminal of the fourth transistor 210 is connected to a gate terminal of the third transistor 209. A first terminal of the fourth transistor 210 is connected to a second terminal of the third transistor 209. A second terminal of the fourth transistor 210 is connected to the ground line 213. In this case, a connection portion of the gate terminal of the third transistor 209, the gate terminal of the fourth transistor 210, and another element is an input terminal of the second inverter circuit 206. The first terminal of the third transistor 209 is a first potential supply terminal of the second inverter circuit 206. The second terminal of the fourth transistor 210 is a second potential supply terminal of the second inverter circuit 206. A connection portion between the second terminal of the third transistor 209 and the first terminal of the fourth transistor 210 is an output terminal of the second inverter circuit 206.

The input terminal of the first inverter circuit 205 is connected to the output terminal of the second inverter circuit 206. The output terminal of the first inverter circuit 205 is connected to the input terminal of the second inverter circuit 206.

A gate terminal of the fifth transistor 201 is connected to the word line 211. A first terminal of the fifth transistor 201 is connected to the first data line 215. A second terminal of the fifth transistor 201 is connected to the output terminal of the first inverter circuit 205.

A gate terminal of the sixth transistor 202 is connected to the word line 211. A first terminal of the sixth transistor 202 is connected to the output terminal of the second inverter circuit 206. A second terminal of the sixth transistor 202 is connected to the second data line 216.

A gate terminal of the seventh transistor 203 is connected to the input terminal of the first inverter circuit 205 and the output terminal of the second inverter circuit 206. A first terminal of the seventh transistor 203 is connected to the ground line 213. A connection portion of the gate terminal of the seventh transistor 203, the input terminal of the first inverter circuit 205, and the second inverter circuit 206 is a first node 218. A connection, portion of the output terminal of the first inverter circuit 205 and the input terminal of the second inverter circuit 206 is a second node 219.

A gate terminal of the eighth transistor 204 is connected to the word line 214. A first terminal of the eighth transistor 204 is connected to a second terminal of the seventh transistor 203. A second terminal of the eighth transistor 204 is connected to the third data line 217.

Normal data of writing data is input to the first data line 215 and an inverted data of the writing data is input to the second data line 216. The third data line 217 is precharged with 3 V by a writing/reading circuit except during data is being read out. Here, the writing/reading circuit has functions of outputting writing data to a memory cell through the first data line 215 and the second data line 216 and reading out data in a memory cell from a potential of the third data line 217. In the case where a plurality of initialization memory cells is arranged in a line, at least one writing/reading circuit corresponding thereto is provided.

Note that the initialization memory cell in FIG. 8 includes the bias circuit 220. The bias circuit 220 is connected to a substrate terminal of the first transistor 207.

In this embodiment mode, as the first transistor 207, a transistor in which a first gate terminal and a second gate terminal are provided with an active layer interposed therebetween can be used for example. In this transistor, a first voltage is applied to the active layer from the first gate terminal and a second voltage is applied to the active layer from the second gate terminal. A threshold voltage of the transistor can be controlled by controlling voltage values of the first voltage and the second voltage applied to the active layer. Note that one of the first gate terminal and the second gate terminal is referred to as a substrate terminal, and a voltage applied to the substrate terminal is referred to as a substrate voltage in some cases.

Next, as an example of a transistor which can be applied to this embodiment mode, the transistor in which the first gate terminal and the second gate terminal are provided with the active layer interposed therebetween will be described.

Figure 9:
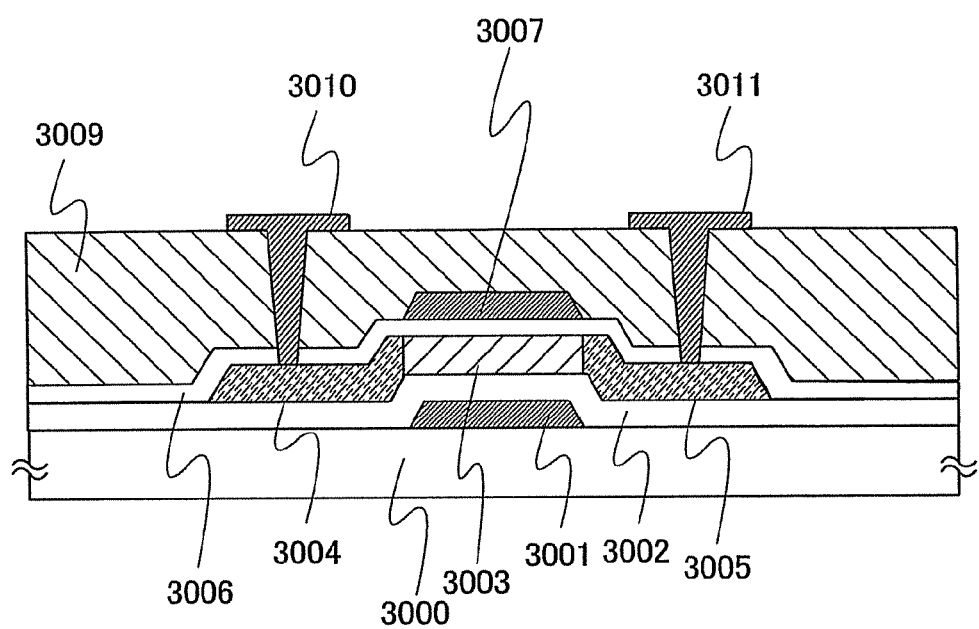
FIG. 9 is a cross-sectional view of an example of a transistor which can be applied to a semiconductor memory device of the present invention in Embodiment Mode 2.

A transistor shown in FIG. 9 includes a substrate 3000, a first gate electrode 3001 provided over the substrate 3000, a first gate insulating layer 3002 provided over the first gate electrode 3001, a semiconductor layer 3003 provided over the first gate insulating layer 3002, a second gate insulating layer 3006 provided over the semiconductor layer 3003, and a second gate electrode 3007 provided over the second gate insulating layer 3006. Further, the semiconductor layer 3003 includes a first impurity region 3004 and a second impurity region 3005. There is a channel-forming region between the first impurity region 3004 and the second impurity region 3005. An insulating layer 3009 is formed over the second gate electrode 3007. The given number of contact portions are provided in parts of the insulating layer 3009, and a first wiring 3010 and a second wiring 3011 are formed over the first impurity region 3004 and the second impurity region 3005, respectively, through the contact portions.

As the substrate 3000, a glass substrate, a quartz substrate, a metal substrate (e.g., a stainless-steel substrate), a ceramics substrate, or the like can be used. In addition, a plastic substrate made of polyethylene terephthalate (PET), polyethylene naphthalate (PEN), polyethersulfone (PES), acrylic, or the like can be used.

Moreover, the first gate insulating layer 3002, the second gate insulating layer 3006, and the insulating layer 3009 each can be formed of any one of or a plurality of silicon oxide, silicon nitride, silicon oxynitride, and silicon nitride oxide. Further, the first gate insulating layer 3002, the second gate insulating layer 3006, and the insulating layer 3009 each can be formed with a stacked-layer structure of selected materials from the above mentioned materials. The first gate insulating layer 3002, the second gate insulating layer 3006, and the insulating layer 3009 can be formed by CVD, sputtering, or the like.

Further, the semiconductor layer 3003 can be fowled of amorphous silicon, polycrystalline silicon, microcrystalline silicon (also referred to as semi-amorphous silicon), or the like. Furthermore, the semiconductor layer 3003 can be formed by sputtering, LPCVD, plasma CVD, or the like.

Furthermore, the semiconductor layer 3003 is irradiated with a laser beam to be crystallized. Note that the semiconductor layer 3003 can also be crystallized by a method in which laser beam irradiation, thermal crystallization using RTA or an annealing furnace, and thermal crystallization using a metal element which promotes crystallization are combined, or the like. After that, the obtained crystalline semiconductor film is etched into a desired shape so that the semiconductor layer 3003 is formed. Note that a laser beam similar to the laser beam which can be employed for the semiconductor layer in Embodiment Mode 1 can be used.

The first gate electrode 3001 and the second gate electrode 3007 each can be formed by using an element selected from tantalum, tungsten, titanium, molybdenum, aluminum, copper, chromium, niobium, or the like, or an alloy material or compound material containing any of the elements as its main component. Alternatively, a semiconductor material typified by polycrystalline silicon which is doped with an impurity element such as phosphorus can be used. Alternatively, a stacked-layer structure of one or a plurality of elements selected from those listed above can be employed. Examples of a combination of the elements listed above includes: a tantalum nitride film and a tungsten film, a tungsten nitride film and a tungsten film, a molybdenum nitride film and a molybdenum film, and the like. Since tungsten and tantalum nitride have high heat resistance, thermal treatment for thermal activation can be performed after a first layer and a second layer of the gate electrode are formed. Alternatively, not only a two-layer structure but also a three-layer structure can be employed. In the case of the three-layer structure, for example, a stacked-layer structure of a molybdenum film, an aluminum film, and a molybdenum film can be employed.

The first impurity region 3004 and the second impurity region 3005 each can be formed by adding an impurity element to part of the semiconductor layer 3003. If the impurity element is desired to be added to predetermined regions, a resist is fowled and the impurity element is added using the resist as a mask, whereby each of the first impurity region 3004 and the second impurity region 3005 containing a desired element in a desired region can be formed. Note that as the impurity element, phosphorus or boron can be used.

As the insulating layer 3009, one or more of an inorganic material such as oxide of silicon or nitride of silicon; an organic material such as polyimide, polyamide, benzocyclobutene, acrylic, or epoxy; and a siloxane material can be used. Further, a stacked-layer structure of one or a plurality of materials selected from those listed above can also be employed.

The first wiring 3010 and the second wiring 3011 each function as a source wiring and a drain wiring, and each can be formed from an element selected from aluminum, tungsten, titanium, tantalum, molybdenum, nickel, platinum, copper, gold, silver, manganese, neodymium, carbon, or silicon, or an alloy material or compound material containing any of the elements listed above. Further, a stacked-layer structure of one or a plurality of elements selected from those listed above can also be employed. As an alloy material containing aluminum as its main component, for example, a material containing aluminum as its main component and also nickel, or an alloy material containing aluminum as its main component, nickel, and one or both of carbon and silicon, or the like can be used. The first wiring 3010 and the second wiring 3011 each may employ, for example, a stacked-layer structure of a barrier film, an aluminum-silicon (Al—Si) film, and a barrier film, or a stacked-layer structure of a barrier film, an aluminum-silicon (Al—Si) film, a titanium nitride film, and a barrier film. It is to be noted that a barrier film corresponds to a thin film made of titanium, a nitride of titanium, molybdenum, or a nitride of molybdenum. Aluminum and aluminum silicon which have low resistance and are inexpensive are optimal materials for forming the first wiring 3010 and the second wiring 3011. In addition, generation of a hillock of aluminum or aluminum silicon can be prevented when upper and lower barrier layers are formed. Furthermore, when the barrier film is formed by using titanium that is a highly-reducible element, even if a thin natural oxide film is formed on the crystalline semiconductor film, the natural oxide film can be reduced so that preferable contact with the crystalline semiconductor film can be obtained.

Either the first impurity region 3004 and the first wiring 3010, or the second impurity region 3005 and the second wiring 3011 functions as either a source terminal or a drain terminal. A channel-forming region is formed between the first impurity region 3004 and the second impurity region 3005.

The first electrode 3001 or the second gate electrode 3007 functions as a substrate terminal (also referred to as a control terminal) in a transistor. A threshold voltage of the transistor can be controlled by application of a voltage to the channel-forming region from the bias circuit 220 in Embodiment Mode 2 through the first gate electrode 3001 or the second gate electrode 3007.

Figure 10:
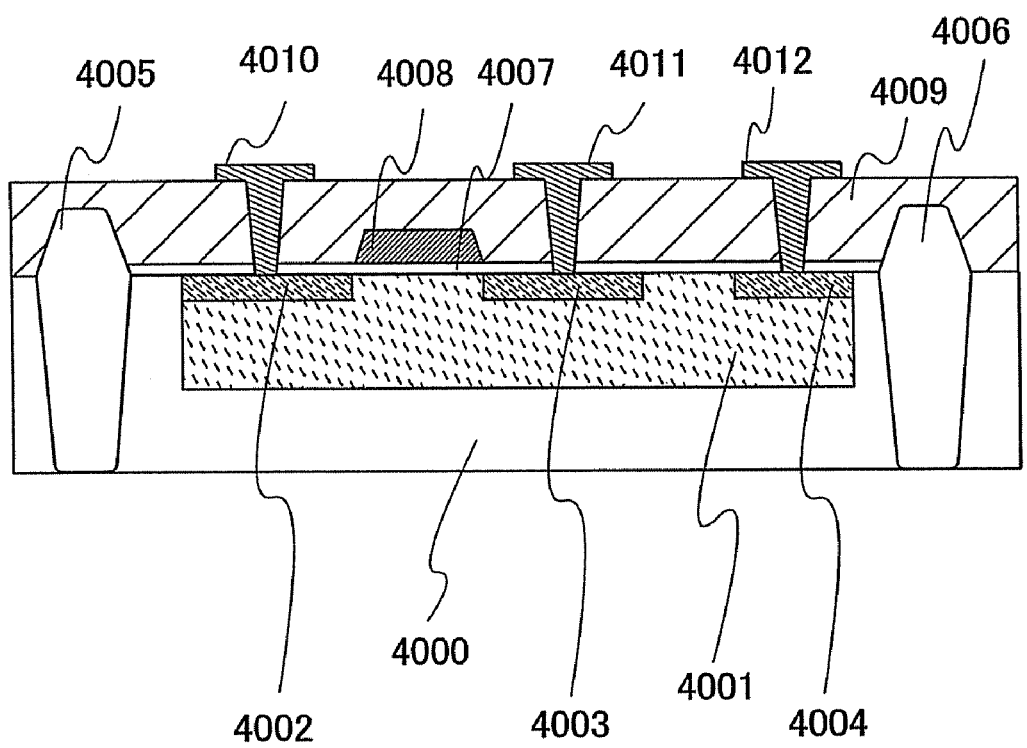
FIG. 10 is a cross-sectional view of an example of a transistor which can be applied to a semiconductor memory device of the present invention in Embodiment Mode 2.

Next, as an example of a transistor which can be applied to a memory device of the present invention, a structure is shown in a cross-sectional view of a transistor having a single crystal semiconductor layer with reference to FIG. 10.

A transistor shown in FIG. 10 includes a substrate 4000, a gate insulating layer 4007 formed over the substrate 4000, a first insulating layer 4005, a second insulating layer 4006, and a gate electrode 4008 formed over the gate insulating layer 4007. Part of the substrate 4000 is a well region 4001. The well region 4001 includes a first impurity region 4002, a second impurity region 4003, and a third impurity region 4004. The gate insulating layer 4007 and the gate electrode 4008 are formed over a region between the first impurity region 4002 and the second impurity region 4003 in the substrate 4000. Further, an insulating layer 4009 is formed over the gate electrode 4008 and the substrate 4000. The given number of contact portions are provided in parts of the insulating layer 4009, and a first wiring 4010, a second wiring 4011, and a third wiring 4012 are formed over the first impurity region 4002, the second impurity region 4003, and the third impurity region 4004, respectively, through the contact portions.

In the case where a transistor having a single crystal semiconductor layer is employed, at least first to third impurity regions are provided in the single crystal semiconductor layer which functions as an active layer. The first impurity region is a source region, the second impurity region is a drain region, and the third impurity region is a region to which a voltage is applied. In this transistor, the first voltage is applied to the active layer from the gate electrode, and the second voltage is applied to the active layer from the third impurity region. A threshold voltage of the transistor can be controlled by controlling the voltage values of the first voltage and the second voltage applied to the active layer. Note that the third impurity region is referred to as a substrate terminal and a voltage applied to the third impurity region is referred to as a substrate voltage in some cases.

As the substrate 4000, for example, a single-crystal silicon substrate having a n-type or p-type conductivity, or a compound semiconductor substrate (a GaAs substrate, an InP substrate, a GaN substrate, an SiC substrate, a sapphire substrate, a ZnSe substrate, or the like) can be used.

In order to form the first insulating layer 4005 and the second insulating layer 4006, a selective oxidation method (a LOCOS (local oxidation of silicon) method), a trench isolation method, or the like can be used.

The gate electrode 4008 can be formed of an element selected from tantalum, tungsten, titanium, molybdenum, aluminum, copper, chromium, niobium, or the like, or an alloy material or a compound material containing any of the elements as its main component. Alternatively, the gate electrode 4008 can be formed of a semiconductor such as polycrystalline silicon doped with an impurity element which imparts a conductivity to a semiconductor film, such as phosphorus. Further, the gate electrode 4008 can be fowled by being patterned (patterning or the like) into a predetermined shape.

The well region 4001, the first impurity region 4002, the second impurity region 4003, and the third impurity region 4004 can be formed by addition of an impurity element. As the impurity element, an impurity element imparting n-type or p-type conductivity is used. As the impurity element imparting n-type conductivity, phosphorus, arsenic, or the like can be used. As the impurity element imparting p-type conductivity, boron, aluminum, gallium, or the like can be used. If the impurity element is desired to be added to predetermined regions, a resist is formed and the impurity element is added using the resist as a mask, whereby the well region 4001, the first impurity region 4002, the second impurity region 4003, and the third impurity region 4004 containing a desired element in the predetermined region can be formed.

The gate insulating layer 4007 can be formed using an inorganic material, an organic material, or a mixed material of an organic material and an inorganic material. For example, a film containing silicon oxide, silicon oxynitride, silicon nitride oxide, or carbon typified by DLC (diamond like carbon), acrylic, epoxy, polyimide, polyamide, polyvinylphenol, benzocyclobutene, or the like can be used. In addition, the first insulating layer 4005 and the second insulating layer 4006 can be formed by a CVD method, a sputtering method, a droplet discharging method, or a printing method in accordance with a material thereof.

Either the first impurity region 4002 and the first wiring 4010, or the second impurity region 4003 and the second wiring 4011 functions as either a source terminal or a drain terminal. A channel-forming region is formed between the first impurity region 4002 and the second impurity region 4003.

The third impurity region 4004 and the third wiring 4012 function as a substrate terminal (also referred to as a control terminal) to which a voltage (a substrate voltage) different from a voltage applied to another terminal of the transistor. Thus, a threshold voltage of the transistor can be controlled by application of a voltage to the channel-forming region from the bias circuit 220 in FIG. 8 through the third wiring 4012.

When a potential is input to the first transistor 207, in which the substrate terminal is provided, from the substrate terminal, a voltage is applied to a channel portion of the first transistor 207. Thus, the threshold voltage is changed so that rising characteristics and falling characteristics in the first inverter circuit 205 can be changed.

Differences between rising characteristics and between falling characteristics of the first inverter circuit 205 and the second inverter circuit 206 with respect to an input signal are made so that data to be held in the initialization memory cell is determined corresponding thereto. For example, a rising characteristic of the third transistor 209 in the second inverter circuit 206 is set to be better than that of the first transistor 207 in the first inverter circuit 205. Thus, immediately after power supply is turned on, the third transistor 209 can output larger amount of current faster than the first transistor 207 and therefore, the potential of the first node 218 can be 3 V. When the potential of the first node 218 is determined, the potential of the second node 219 is determined to be 0 V by the n-channel transistor in the first inverter circuit 205. In this manner, since the data in the memory cell is made to be 0, initialization processing can be performed at the same time as power supply is turned on.

In this manner, by making differences between rising characteristics and between falling characteristics of the first inverter circuit 205 and the second inverter circuit 206, the potentials of the first node 218 and the second node 219 can be determined more quickly.

In addition, since a constant voltage can be applied by controlling the substrate voltage, differences between rising characteristics and between falling characteristics of one transistor in the first inverter circuit 205 and one transistor which has the same conductivity as the one transistor in the first inverter circuit 205, in the second inverter circuit 206 can be made more obvious. Therefore, initialization processing can be performed more certainly.

Note that in this embodiment mode, if data "0" is held when the word line is valid, and data "1" is held when the word line is invalid, rising characteristics of the first transistor 207 in the first inverter circuit 205 is improved; and therefore, initialization processing can be performed at the same time as the power supply is turned on.

Although a structure in which the bias circuit 220 is connected to the substrate terminal of the first transistor 207 is described in this embodiment mode, the present invention is not limited thereto. For example, a structure in which a transistor having a substrate terminal is applied to the second transistor 208 in the first inverter circuit 205, or the third transistor 209 or the fourth transistor 210 in the second inverter circuit 206, and the bias circuit 220 is connected to the substrate terminal of the transistor can be employed. Alternatively, a structure in which a plurality of bias circuits is used and a transistor having a substrate terminal is used as any of the second transistor 208 in the first inverter circuit 205, and the third transistor 209 and the fourth transistor 210 in the second inverter circuit 206 so that a plurality of transistors each is connected to one bias circuit can be employed. With the plurality of bias circuits, a threshold voltage of each transistor connected to the bias circuit can be controlled and differences between the rising characteristics and between falling characteristics of the first inverter circuit 205 and the second inverter circuit 206 can be made more obvious; and therefore, initialization processing can be performed more certainly at the same time as the power supply is turned on.

In addition, by applying the initialization memory cell of this embodiment mode to a semiconductor memory device, initialization of data in initialization processing in each memory cell can be performed at high speed.

Further, a structure in which a conventional bias circuit is provided can be formed by the same steps as in Embodiment Mode 1.

Note that this embodiment mode can be combined with other embodiment modes as appropriate.

Embodiment Mode 3

In this embodiment mode, a structure and operation of a semiconductor device including a cache memory provided with an initialization memory cell will be described.

Figure 11:
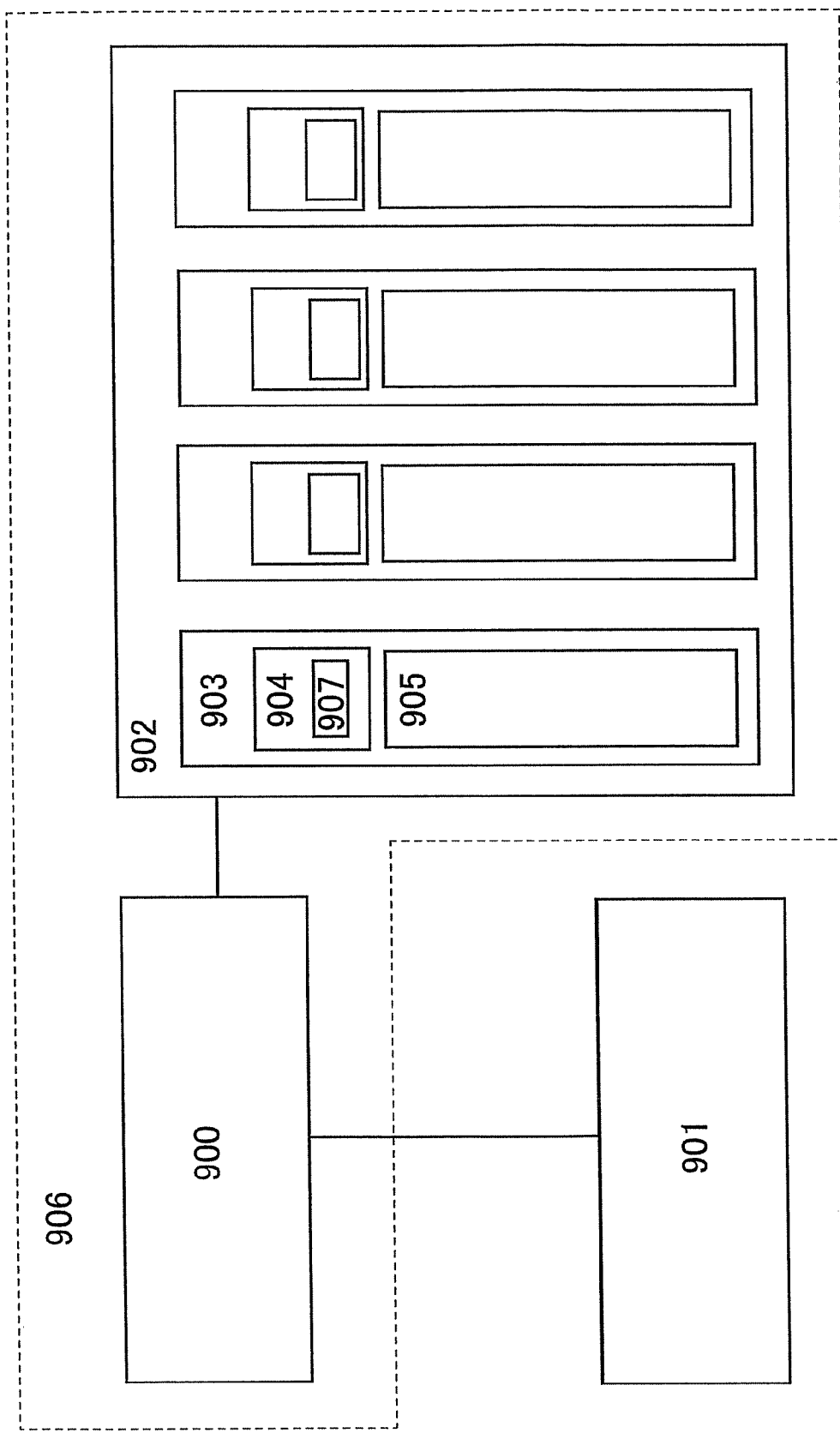
FIG. 11 is a block diagram illustrating a structure of a semiconductor device provided with a semiconductor memory device of the present invention in Embodiment Mode 3.
Figure 12:
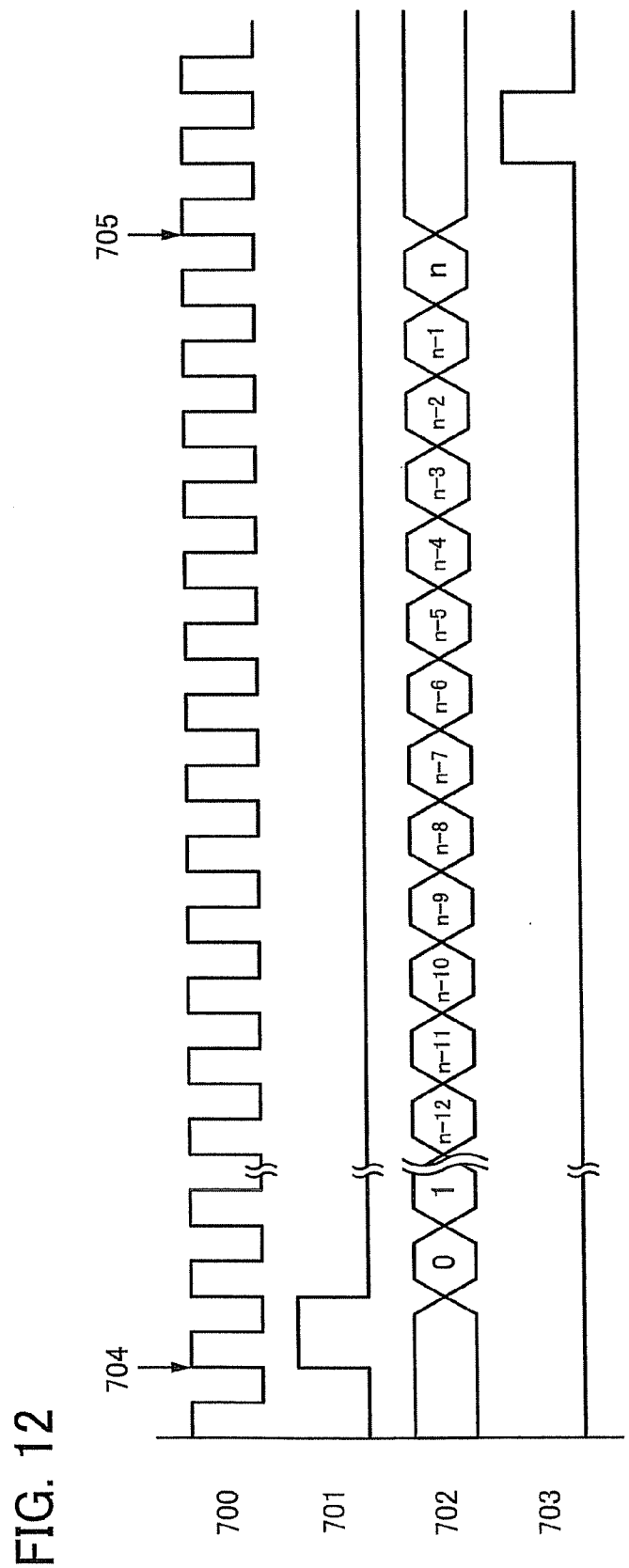
FIG. 12 is a timing chart showing operation of a conventional semiconductor device.

A structure of a semiconductor device of this embodiment mode is shown in FIG. 11. The semiconductor device shown in FIG. 11 includes a CPU 906 and a main memory (also referred to as a second memory device) 901 which functions as a main memory device. Further, the CPU 906 includes an arithmetic unit 900 and a cache memory (also referred to as a first memory device) 902 which functions as a subordinate memory device. Further, the cache memory 902 includes a plurality of memory lines 903 which has a data memory 905 in which partial information of the arithmetic unit 900 is stored, a tag memory 904, and a valid bit 907.

Next, the operation of the semiconductor device of this embodiment mode will be described.

Part of contents in the main memory 901 is copied and the cache memory 902 responds to a command from the CPU. Therefore, data showing an address of the main memory 901 which has the source contents and data held in the address are necessary to be held in the cache memory 902 as a pair of the data. The tag memory 904 included in the cache memory 902 stores the data showing the address of the main memory 901 which has the source contents. In addition, the valid bit 907 has functions of showing whether the data stored in the cache memory 902 is valid or invalid and invalidating all the data stored in the cache memory 902 by initializing the valid bit 907 when power is supplied.

In the cache memory 902, the valid bit 907 is necessary to be invalidated at first so that the CPU does not use undefined data. Through this processing, access by the CPU 906 is judged as a cache miss and the undefined data is not to be used.

A case where the structure of the memory cell in Embodiment Modes 1 and 2 is applied to the valid bit 907 will be described. FIG. 1 in Embodiment Mode 1 is used for the description. In this embodiment mode, each memory line 903 includes a valid bit of 1 bit, and holds data "0" when the memory line is valid, and holds data "1" when the memory line is invalid. This can be set as appropriate in accordance with a related circuit configuration; therefore, data showing whether the memory line is valid or invalid can be inverse of the above in some cases.

In the initialization memory cell 100 in the present invention, differences are made between the rising characteristics and between the falling characteristics of two inverter circuits with respect to an input signal so that data to be held in the initialization memory cell 100 can be determined. The rising characteristic of a p-channel transistor in the second inverter circuit 106 is improved. Thus, immediately after power supply is turned on, the p-channel transistor in the second inverter circuit 106 is turned on faster than a p-channel transistor in the first inverter circuit 105 and can output larger amount of current, and therefore, the potential of the first node 118 can be 3 V. When the potential of the first node 118 is determined, the potential of the second node 119 is determined to be 0 V by the n-channel transistor in the first inverter circuit 105. In this manner, since the data in the initialization memory cell 100 is made to be 0, invalidation processing can be performed on the valid bit at the same time as the power supply is turned on.

A rising characteristic of the n-channel transistor in the first inverter circuit 105 may be improved like as in any of Embodiment Modes 1 and 2. Immediately after the power supply is turned on, the potential of the first node 118, which changes from 0 V to 3 V, is input to the n-channel transistor in the first inverter circuit 105. If the rising characteristic is good, the transistor can be turned on much faster and output larger amount of current. Therefore, the potential of the second node 119, which is increased to 3 V by the first transistor 107 in the first inverter circuit 105, can be decreased to 0 V. Therefore, since the data in the initialization memory cell 100 can be made "0" more certainly, invalidation processing on the valid bit can be performed at the same time as the power supply is turned on.

If the valid bit in each memory line holds data "0" when the memory line is valid, and hold data "1" when the memory line is invalid, a rising characteristic of the p-channel transistor in the first inverter circuit 105 is improved. Further, a rising characteristic of the n-channel transistor in the second inverter circuit 106 is preferably improved.

Further, in that case, a potential of the word line 111 is made not to be 3 V because the potential of the second node 119 is made to be 0 V with certainty.

Further, other circuit elements described in FIG. 5 in Embodiment Mode 1 can be provided for the memory cell. A structure of the valid bit includes the initialization memory cell 100 shown in FIG. 1, the ninth transistor 120, the resistor element 121, and the capacitor element 122 shown in FIG. 5.

A gate terminal of the ninth transistor 120 is connected to the power supply line 112 through the resistor element 121 and to the ground line 113 through the capacitor element 122. A first terminal of the ninth transistor 120 is connected to the word line 111, and a second terminal of the ninth transistor 120 is connected to the ground line 113. A connecting wiring of the gate terminal of the ninth transistor 120, the resistor element 121, and the capacitor element 122 is a wiring 123. Moreover, the ninth transistor 120 is a p-channel transistor. Here, a row decoder circuit has functions of selecting a memory cell for writing data by using the word line 111 and selecting a memory cell for reading data by using the word line 114. At least one row decoder circuit corresponding to the memory line is provided.

Like as Embodiment Mode 1, the timing chart in FIG. 6 can be employed for operation in the case where the memory cell shown in FIG. 1 is applied to the valid bit in the cache memory of this embodiment mode and the circuit shown in FIG. 5 is added to the row decoder as well. When power supply is turned on and a power supply voltage is turned from L to H at an event timing 400 in the signal 300, all the memory cells are invalidated by the structure of the initialization memory cell shown in FIG. 5. When the power supply is turned on, the signal 303 is turned from L to H at the same time, held in that state for a certain period, and turned to L thereafter. Each circuit performs reset operation while the signal 302 is H. The signal 303 is turned from L to H a little later than turning-on of the power supply. Amount of the resistor element 121 and the capacitor element 122 can determine how long the signal 303 is to be delayed from turning-on of the power supply. Since a potential of the word line 111 changes from a ground potential to another potential when the signal 303 is turned from L to H, the signal 303 may be set to be turned from L to H during a reset operation period. After the signal 302 is turned to L, the reset operation is over at an event timing 401 in the signal 300 and a pulse of the signal 304 is input so that access to the cache memory starts.

In this manner, by applying the structure of the memory cell in any of Embodiment Modes 1 and 2 to a cache memory, and providing the cache memory for a semiconductor device, invalidation processing can be performed on all the valid bits at the same time as power supply is turned on; therefore, a CPU can access to the cache memory without waiting for a long time.

Embodiment Mode 4

In this embodiment mode, a manufacturing method of a transistor in a memory cell of a semiconductor memory device which is provided for the semiconductor device of the present invention will be described.

Figure 13A:
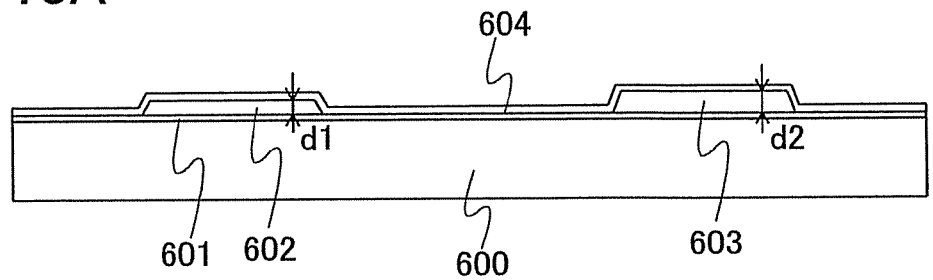
FIGS. 13A to 13D are cross-sectional views illustrating a manufacturing process of a semiconductor memory device of the present invention in Embodiment Mode 4.

First, as shown in FIG. 13A, a first insulating layer 601 is formed over a substrate 600. The first insulating layer 601 can be formed with a single-layer or stacked-layer structure. In this embodiment mode, a two-layer structure is used for the first insulating layer 601. As a first layer of the first insulating layer 601, a silicon oxynitride layer having a thickness of 10 to 200 nm (preferably 50 to 100 nm) is formed. The silicon oxynitride layer can be formed by plasma CVD using $SiH_4$, $NH_3$, $N_2O$, and $H_2$ as reactive gas. Next, as a second layer of the first insulating layer 601, a silicon oxynitride layer having a thickness of 50 to 200 nm (preferably 100 to 150 nm) is formed. The silicon oxynitride layer can be farmed by plasma CVD using $SiH_4$, $N_2O$, and the like as reactive gas. Note that as the substrate 600 and the first insulating layer 601, materials which can be employed for the substrate and the insulating layer of the transistor in the semiconductor memory device of Embodiment Mode 1 can be used.

Next, a semiconductor layer is formed over the first insulating layer 601. As the semiconductor layer, materials which can be employed for the semiconductor layer of the transistor in the semiconductor memory device of Embodiment Mode 1 can be used. The semiconductor layer may be an amorphous, crystalline, or microcrystalline semiconductor layer. A semiconductor layer having a crystalline structure such as a single crystalline or polycrystalline structure is preferably used because mobility of the transistor can be increased.

The thus formed semiconductor layer is processed into a predetermined shape, thereby forming an island-shaped semiconductor layer. When a plurality of transistors, in which the thicknesses of semiconductor layers are made to be different from each other in order to make differences between threshold voltages like the transistors in the semiconductor memory device of the present invention, is formed, a first semiconductor layer 602 having a thickness of d1 and a second semiconductor layer 603 having a thickness of d2 which is greater than the thickness of d1 may be formed for example as shown in FIG. 13A. In the processing, etching using a mask formed by photolithography is performed. As etching, wet etching or dry etching can be employed. In the above-described manner, the first semiconductor layer 602 and the second semiconductor layer 603 are processed so as to have predetermined thicknesses different from each other. Note that the semiconductor layer can be crystallized. As a method for the crystallization, a method which can be employed for the semiconductor layer of the transistor in the semiconductor memory device of Embodiment Mode 1 can be used.

A gate insulating film 604 is formed so as to cover the first semiconductor layer 602 and the second semiconductor layer 603. As the gate insulating film 604, materials which can be employed for the gate insulating layer of the transistor in the semiconductor memory device of Embodiment Mode 1 can be used.

Figure 13B:
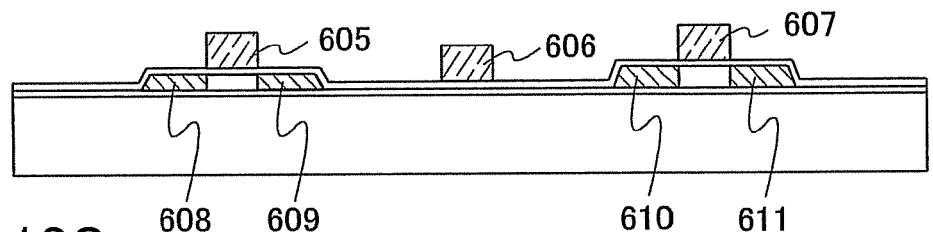

Next, as shown in FIG. 13B, first to third conductive layers 605 to 607 which function as a first gate electrode, a second electrode, and a gate wiring, respectively, are formed over the gate insulating film 604. The conductive layers are processed by etching using a mask that is formed by photolithography. As etching, wet etching or dry etching can be employed. As the first to third conductive layers 605 to 607, materials which can be employed for the wiring of the transistor in the semiconductor memory device of Embodiment Mode 1 can be used.

Here, an impurity element is added to the first semiconductor layer 602 and the second semiconductor layer 603. If an n-channel transistor is formed, phosphorus (P) may be used as the impurity element, while if a p-channel transistor is formed, boron (B) may be used as the impurity element. In this manner, impurity regions 608 to 611 are formed in the first semiconductor layer 602 and the second semiconductor layer 603. At that time, a high concentration impurity region and a low concentration impurity region can be formed in the impurity regions 608 to 611. The low concentration impurity region can prevent a short-channel effect that occurs as a gate length decreases.

After the impurity element is added, thermal treatment is performed if necessary, so that activation of the impurity element and improvement of a surface of the semiconductor layer can be achieved. The thermal treatment may be performed in a similar manner to the crystallization.

Figure 13C:
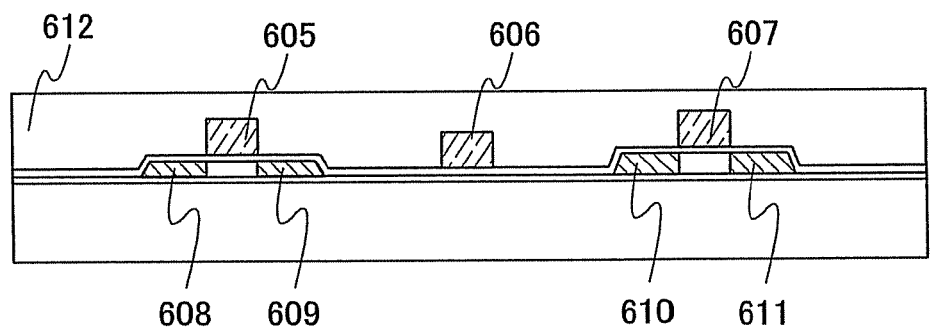

Next, as shown in FIG. 13C, a second insulating layer 612 which functions as an interlayer film is formed so as to cover the semiconductor layers and the gate electrodes. As the interlayer film, a material selected from an organic material or an inorganic material can be used and the interlayer film can be formed with a single-layer structure or a stacked-layer structure. In this embodiment mode, the interlayer film has a stacked-layer structure.

Figure 13D:
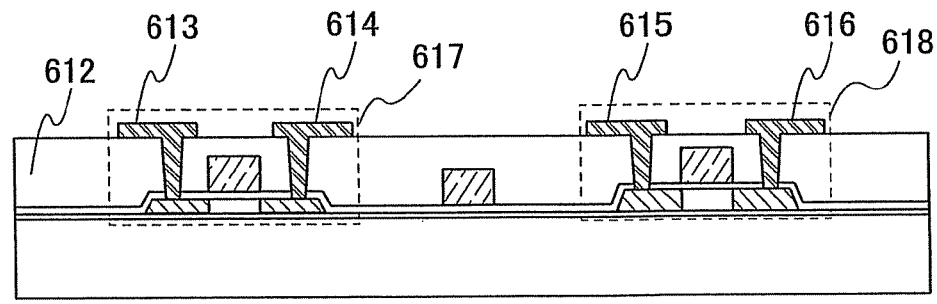

Next, as shown in FIG. 13D, contact holes which penetrates the second insulating layer 612 and the gate insulating film 604 are formed and a first wiring 613 and a second wiring 614 are formed so that the contact holes are filled. The first wiring 613 and the second wiring 614 are connected to the impurity regions 608 to 611 in the first semiconductor layer 602 and the second semiconductor layer 603. Each of the wirings functions as a source electrode or a drain electrode.

In this manner, a first transistor 617 and a second transistor 618 can be formed. Note that the first transistor 617 corresponds to one transistor included in the first inverter circuit 105 and the second transistor 618 corresponds to one transistor included in the second inverter circuit 106.

In addition, the semiconductor memory device in the semiconductor device of the present invention can be manufactured by forming transistors over a glass substrate or a plastic substrate. Further, by fowling n-channel transistors in two inverter circuits, whose semiconductor layers have thicknesses different from each other, difference between the threshold voltages can be made.

Note that this embodiment mode can be combined with any of the other embodiment modes, as appropriate.

Embodiment Mode 5

Examples of the semiconductor device which can be provided with the semiconductor memory device of the present invention includes a camera such as a video camera and a digital camera, a goggle type display (head mounted display), a navigation system, an audio reproducing device (car audio system, audio component, and the like), a notebook personal computer, a game machine, a portable information terminal (mobile computer, mobile phone, portable game machine, electronic book, and the like), and an image reproducing device provided with a recording medium (specifically, a device that reproduces a recording medium such as a DVD: Digital Versatile Disc and has a display for displaying the reproduced image). Specific examples of these semiconductor devices are shown in FIGS. 14A to 14E.

Figure 14A:
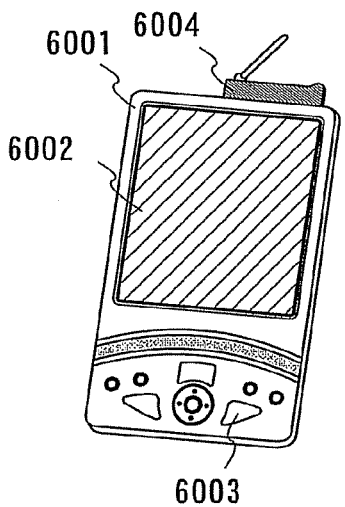
FIGS. 14A to 14E are diagrams showing examples of use of a semiconductor device provided with a semiconductor memory device of the present invention in Embodiment Mode 5.

FIG. 14A is a portable information terminal (so-called PDA: Personal Digital Assistant) that includes a main body 6001, a display portion 6002, an operating key 6003, a modem 6004, and the like. The semiconductor device of the present invention is used as a memory included in the main body 6001. The semiconductor device of the present invention allows a portable information terminal with high processing speed to be provided.

Figure 14B:
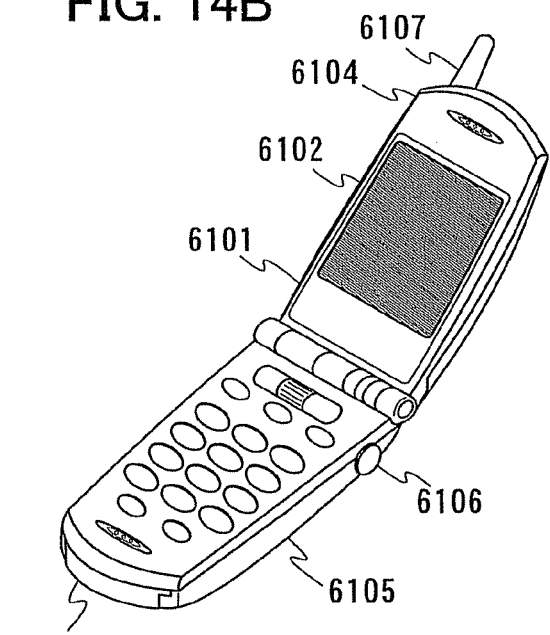

FIG. 14B is a mobile phone that includes a main body 6101, a display portion 6102, an audio input portion 6103, an audio output portion 6104, an operating key 6105, an external connecting port 6106, an antenna 6107, and the like. The semiconductor device of the present invention is used as a memory included in the main body 6101. The semiconductor device of the present invention allows a mobile phone with high processing speed to be provided.

Figure 14C:
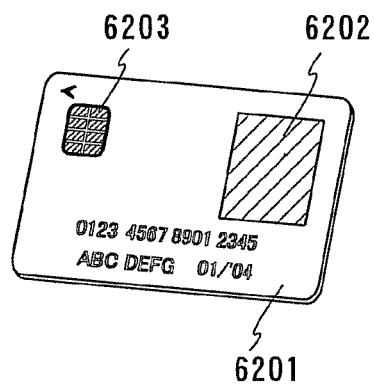

FIG. 14C is an electronic card that includes a main body 6201, a display portion 6202, a connecting terminal 6203, and the like. The semiconductor device of the present invention is used as a memory element included in the main body 6201. The semiconductor device of the present invention allows an electronic card with high processing speed to be provided. Note that a contact type electronic card is shown in FIG. 14C; however, the semiconductor device of the present invention can also be applied to a noncontact type electronic card or an electronic card having both functions of a contact type and a noncontact type.

Figure 14D:
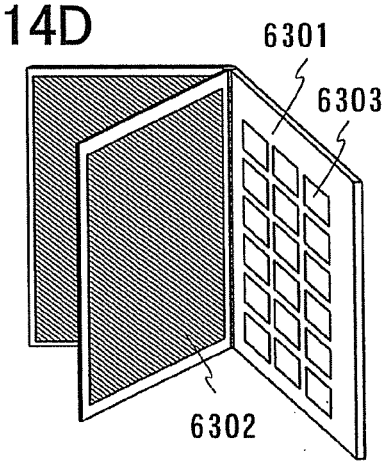

FIG. 14D is an electronic book that includes a main body 6301, a display portion 6302, an operating key 6303, and the like. The semiconductor device of the present invention is used as a memory included in the main body 6301. Further, a modem may be incorporated in the main body 6301 of the electronic book. The semiconductor device of the present invention allows an electronic book with high processing speed to be provided.

Figure 14E:
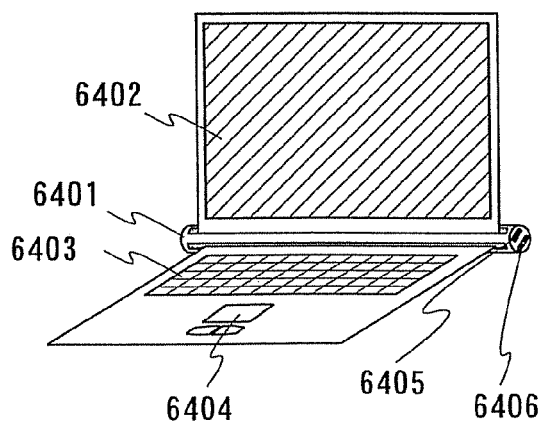

FIG. 14E is a computer that includes a main body 6401, a display portion 6402, a keyboard 6403, a touch pad 6404, an external connecting port 6405, a power plug 6406, and the like. The SRAM of the invention is used as a memory element included in the main body 2401. The semiconductor device of the present invention allows a computer with high processing speed to be provided.

As described in this embodiment mode, the application range of the present invention is so wide that it can be used for semiconductor devices of various fields. Note that the semiconductor devices of this embodiment mode can be implemented in combination with any of the configurations and manufacturing methods shown in other Embodiment Modes.

This application is based on Japanese Patent Application serial no. 2007-172938 filed with Japan Patent Office on Jun. 29, 2007, the entire contents of which are hereby incorporated by reference.

What is claimed is:

1. A semiconductor memory device comprising:
a plurality of data hold memory cells;
an initialization memory cell;
a first data line;
a second data line; and
a word line,
wherein each of the plurality of data hold memory cells and the initialization memory cell comprises:
a first inverter circuit comprising a first transistor;
a second inverter circuit comprising a second transistor;
a third transistor; and
a fourth transistor,
wherein the word line is electrically connected to a gate electrode of the third transistor and a gate electrode of the fourth transistor,
wherein an input terminal of the first inverter circuit is electrically connected to an output terminal of the second inverter circuit and the second data line,
wherein an output terminal of the first inverter circuit is electrically connected to an input terminal of the second inverter circuit and the first data line,
wherein an absolute value of a threshold voltage of the second transistor is smaller than an absolute value of a threshold voltage of the first transistor in the initialization memory cell and
wherein the plurality of data hold memory cells and the initialization memory cell are electrically connected through the word line.

2. A semiconductor memory device comprising:
a plurality of data hold memory cells;
an initialization memory cell;
a first data line;
a second data line; and
a word line,
wherein each of the plurality of data hold memory cells and the initialization memory cell comprises:
a first inverter circuit comprising a first transistor;
a second inverter circuit comprising a second transistor;
a third transistor; and
a fourth transistor,
wherein the word line is electrically connected to a gate electrode of the third transistor and a gate electrode of the fourth transistor,
wherein an input terminal of the first inverter circuit is electrically connected to an output terminal of the second inverter circuit and the second data line,
wherein an output terminal of the first inverter circuit is electrically connected to an input terminal of the second inverter circuit and the first data line,
wherein a thickness of a semiconductor layer of the first transistor is more than a thickness of a semiconductor layer of the second transistor,
wherein an absolute value of a threshold voltage of the second transistor is smaller than an absolute value of a threshold voltage of the first transistor in the initialization memory cell, and
wherein the plurality of data hold memory cells and the initialization memory cell are electrically connected through the word line.

3. A semiconductor memory device comprising:
a plurality of data hold memory cells;
an initialization memory cell;
a first data line;
a second data line;
a third data line;
a word line; and
a ground line,
wherein each of the plurality of data hold memory cells and the initialization memory cell comprises:
a first inverter circuit comprising a first transistor;
a second inverter circuit comprising a second transistor;
a third transistor electrically connected to the ground line; and
a fourth transistor electrically connected to the third transistor, wherein a gate electrode of the fourth transistor is electrically connected to the word line,
wherein an input terminal of the first inverter circuit is electrically connected to an output terminal of the second inverter circuit, the second data line, and a gate electrode of the third transistor,
wherein an output terminal of the first inverter circuit is electrically connected to an input terminal of the second inverter circuit and the first data line,
wherein the second inverter circuit is electrically connected to the third data line through the third transistor and the fourth transistor,
wherein a thickness of a semiconductor layer of the first transistor is more than a thickness of a semiconductor layer of the second transistor, and
wherein an absolute value of a threshold voltage of the second transistor is smaller than an absolute value of a threshold voltage of the first transistor in the initialization memory cell, and
wherein the plurality of data hold memory cells and the initialization memory cell are electrically connected through the word line.

4. A semiconductor memory device comprising:
a plurality of data hold memory cells;
an initialization memory cell;
a first data line;
a second data line;
a third data line;
a word line; and
a power supply line,
wherein each of the plurality of data hold memory cells and the initialization memory cell comprises:
a first inverter circuit comprising a first transistor, wherein the first inverter circuit is electrically connected to the power supply line;
a second inverter circuit comprising a second transistor, wherein the second inverter circuit is electrically connected to the power supply line;
a third transistor; and
a fourth transistor electrically connected to the third transistor, wherein a gate electrode of the fourth transistor is electrically connected to the word line,
wherein an input terminal of the first inverter circuit is electrically connected to an output terminal of the second inverter circuit and a gate electrode of the third transistor,
wherein an output terminal of the first inverter circuit is electrically connected to an input terminal of the second inverter circuit and the first data line,
wherein the second data line is electrically connected to the input terminal of the first inverter circuit and the output terminal of the second inverter circuit,
wherein the power supply line is electrically connected to the third data line through the third transistor and the fourth transistor,
wherein a thickness of a semiconductor layer of the first transistor is more than a thickness of a semiconductor layer of the second transistor, and
wherein an absolute value of a threshold voltage of the second transistor is smaller than an absolute value of a threshold voltage of the first transistor in the initialization memory cell, and
wherein the plurality of data hold memory cells and the initialization memory cell are electrically connected through the word line.

5. The semiconductor memory device according to claim 2,
wherein the thickness of the semiconductor layer of the first transistor is more than or equal to quarter and less than or equal to half a channel length of the first transistor, and
wherein the thickness of the semiconductor layer of the second transistor is more than or equal to half a channel length of the second transistor.

6. The semiconductor memory device according to claim 3,
wherein the thickness of the semiconductor layer of the first transistor is more than or equal to quarter and less than or equal to half a channel length of the first transistor, and
wherein the thickness of the semiconductor layer of the second transistor is more than or equal to half a channel length of the second transistor.

7. The semiconductor memory device according to claim 4,
wherein the thickness of the semiconductor layer of the first transistor is more than or equal to quarter and less than or equal to half a channel length of the first transistor, and wherein the thickness of the semiconductor layer of the second transistor is more than or equal to half a channel length of the second transistor.

8. The semiconductor memory device according to claim 1, wherein one of the first transistor and the second transistor comprises a substrate terminal adjacent to a semiconductor layer of the one of the first transistor and the second transistor with a gate insulating layer therebetween, and
wherein the substrate terminal is supplied with a voltage for controlling a threshold voltage of the one of the first transistor and the second transistor.

9. The semiconductor memory device according to claim 2, wherein one of the first transistor and the second transistor comprises a substrate terminal adjacent to the semiconductor layer of the one of the first transistor and the second transistor with a gate insulating layer therebetween, and
wherein the substrate terminal is supplied with a voltage for controlling a threshold voltage of the one of the first transistor and the second transistor.

10. The semiconductor memory device according to claim 3,
wherein one of the first transistor and the second transistor comprises a substrate terminal adjacent to the semiconductor layer of the one of the first transistor and the second transistor with a gate insulating layer therebetween, and
wherein the substrate tei iiinal is supplied with a voltage for controlling a threshold voltage of the one of the first transistor and the second transistor.

11. The semiconductor memory device according to claim 4,
wherein one of the first transistor and the second transistor comprises a substrate terminal adjacent to the semiconductor layer of the one of the first transistor and the second transistor with a gate insulating layer therebetween, and
wherein the substrate terminal is supplied with a voltage for controlling a threshold voltages of the one of the first transistor and the second transistor.

12. The semiconductor memory device according to claim 1, wherein the semiconductor memory device is incorporated into a semiconductor device as a first memory device,
wherein the semiconductor device further comprises:
a CPU including an arithmetic unit, and
a second memory device,
wherein the second memory device is a main memory device, and
wherein the first memory device is a subordinate memory device.

13. The semiconductor memory device according to claim 2, wherein the semiconductor memory device is incorporated into a semiconductor device as a first memory device,
wherein the semiconductor device further comprises:
a CPU including an arithmetic unit, and
a second memory device,
wherein the second memory device is a main memory device, and
wherein the first memory device is a subordinate memory device.

14. The semiconductor memory device according to claim 3, wherein the semiconductor memory device is incorporated into a semiconductor device as a first memory device,
wherein the semiconductor device further comprises:
a CPU including an arithmetic unit, and
a second memory device,
wherein the second memory device is a main memory device, and
wherein the first memory device is a subordinate memory device.

15. The semiconductor memory device according to claim 4, wherein the semiconductor memory device is incorporated into a semiconductor device as a first memory device,
wherein the semiconductor device further comprises:
a CPU including an arithmetic unit, and
a second memory device,
wherein the second memory device is a main memory device, and
wherein the first memory device is a subordinate memory device.

16. The semiconductor memory device according to claim 1, further comprising:
a power supply line;
a ground line;
a fifth transistor;
a resistor; and
a capacitor,
wherein the power supply line is electrically connected to the first transistor and the second transistor,
wherein a gate terminal of the fifth transistor is electrically connected to the power supply line through the resistor, and
wherein the gate terminal of the fifth transistor is electrically connected to the ground line through the capacitor.

17. The semiconductor memory device according to claim 2, further comprising:
a power supply line;
a ground line;
a fifth transistor;
a resistor; and
a capacitor,
wherein the power supply line is electrically connected to the first transistor and the second transistor,
wherein a gate terminal of the fifth transistor is electrically connected to the power supply line through the resistor, and
wherein the gate terminal of the fifth transistor is electrically connected to the ground line through the capacitor.

18. The semiconductor memory device according to claim 3, further comprising:
a power supply line;
a fifth transistor;
a resistor; and
a capacitor,
wherein a gate terminal of the fifth transistor is electrically connected to the power supply line through the resistor, and
wherein the gate terminal of the fifth transistor is electrically connected to the ground line through the capacitor.

19. The semiconductor memory device according to claim 4, further comprising:
a ground line;
a fifth transistor;
a resistor; and
a capacitor,
wherein a gate terminal of the fifth transistor is electrically connected to the power supply line through the resistor, and
wherein the gate terminal of the fifth transistor is electrically connected to the ground line through the capacitor.

* * * * *

UNITED STATES PATENT AND TRADEMARK OFFICE
CERTIFICATE OF CORRECTION

PATENT NO.         : 8,259,487 B2
APPLICATION NO.    : 13/086784
DATED              : September 4, 2012
INVENTOR(S)        : Masashi Fujita It is certified that error appears in the above-identified patent and that said Letters Patent is hereby corrected as shown below:

Column 11, Line 6; Change "single-crystal YAG;" to --single-crystal YAG,--.

Column 18, Line 43; Change "A connection, portion" to --A connection portion--.

Column 19, Line 49; Change "fowled" to --formed--.

Column 20, Line 23; Change "fowled" to --formed--.

Column 22, Line 1; Change "fowled" to --formed--.

Column 26, Line 4; Change "farmed" to --formed--.

Column 27, Line 31; Change "fowling" to --forming--.

Column 31, Line 31, Claim 10; Change "tei iiinal" to --terminal--.

Signed and Sealed this

Thirteenth Day of November, 2012

David J. Kappos
*Director of the United States Patent and Trademark Office*